United States Patent [19]

Kodaira et al.

[11] Patent Number: 5,677,547
[45] Date of Patent: *Oct. 14, 1997

[54] THIN FILM TRANSISTOR AND DISPLAY DEVICE INCLUDING SAME

[75] Inventors: Toshimoto Kodaira; Hiroyuki Oshima; Toshihiko Mano, all of Suwa, Japan

[73] Assignee: Seiko Epson Corporation, Tokyo, Japan

[*] Notice: The term of this patent shall not extend beyond the expiration date of Pat. No. 5,365,079.

[21] Appl. No.: 461,933

[22] Filed: Jun. 5, 1995

Related U.S. Application Data

[63] Continuation-in-part of Ser. No. 259,354, May 3, 1994, which is a continuation of Ser. No. 14,053, Feb. 5, 1993, Pat. No. 5,365,079, which is a continuation of Ser. No. 803,699, Dec. 4, 1991, abandoned, which is a continuation of Ser. No. 484,466, Feb. 22, 1990, abandoned, which is a continuation of Ser. No. 285,292, Dec. 15, 1988, abandoned, which is a continuation of Ser. No. 894,432, Jul. 16, 1986, abandoned, which is a continuation of Ser. No. 489,986, Apr. 29, 1983, abandoned.

[30] Foreign Application Priority Data

| Apr. 30, 1982 | [JP] | Japan | 57-74014 |
| Apr. 30, 1982 | [JP] | Japan | 57-74015 |
| May 6, 1982 | [JP] | Japan | 57-75814 |

[51] Int. Cl.$^6$ .................... H01L 29/786; H01L 29/04
[52] U.S. Cl. ................................ 257/59; 257/72
[58] Field of Search .......................... 257/59, 72

[56] References Cited

U.S. PATENT DOCUMENTS

| 3,840,695 | 10/1974 | Fischer . |
| 4,024,562 | 5/1977 | Brown et al. . |
| 4,239,346 | 12/1980 | Lloyd . |
| 4,291,322 | 9/1981 | Clemens et al. . |
| 4,332,075 | 6/1982 | Ota et al. . |
| 4,336,295 | 6/1982 | Smith . |
| 4,385,292 | 5/1983 | Nonomura et al. . |
| 4,404,578 | 9/1983 | Takafuji et al. . |
| 4,431,271 | 2/1984 | Okubo . |
| 4,455,568 | 6/1984 | Shiota . |
| 4,543,573 | 9/1985 | Fuyama et al. . |
| 4,582,395 | 4/1986 | Morozumi . |
| 4,935,792 | 6/1990 | Tanaka et al. ............ 257/72 |
| 5,359,206 | 10/1994 | Yamamoto et al. ....... 257/72 |

FOREIGN PATENT DOCUMENTS

| 54-20692 | 2/1979 | Japan . |
| 58-125087 | 6/1983 | Japan . |
| 60-261174 | 12/1985 | Japan ............... 257/59 |
| 2067353 | 12/1980 | United Kingdom . |
| 2066545 | 7/1981 | United Kingdom . |

OTHER PUBLICATIONS

Hayama et al., "Amorphous–silicon thin–film metal–oexide–semiconductor transistors," *Appl. Phys. Lett.* 36(9), May 1, 1980, p. 754–755.

Hosokawa et al, "Dichroic Guest–Host Active Matrix Video Display," *Biennial Display Research Conference*, Paper 11.6 (1980). no month.

Kamins et al., "Hydrogenation of Transistors Fabricated in Polycrystalline–Silicone Films," *IEEE Elec. Dev. Lett.*, vol. EDL–1, No. 8, Aug. 1980, pp. 159–161.

Morozumi, "Active Matrix Addressed Liquid–Crystal Displays," *1985 International Display Research Conference*, pp. 9–13. no month.

*Primary Examiner*—Jerome Jackson
*Attorney, Agent, or Firm*—Oliff & Berridge

[57] ABSTRACT

Improved thin film transistors resistant to static electricity induced line faults are provided. The thin film transistors formed in accordance with the invention are particularly well suited for use in an active matrix substrate for a liquid crystal display panel. The liquid crystal display panels include an additional layer formed between crossing source lines and gate lines to provide a higher breakdown voltage between the source lines and gate lines than at the gate insulating layer of the thin film transistors or at a display capacitor.

46 Claims, 16 Drawing Sheets

THIN FILM TRANSISTOR AND DISPLAY DEVICE INCLUDING SAME

This is a Continuation-in-Part of application Ser. No. 08/259,354, filed May 3, 1994 which in turn is a Continuation of 08/014,053 filed Feb. 5, 1993, now U.S. Pat. No. 5,365,079 which in turn is a Continuation of Ser. No. 07/803,699 filed Dec. 4, 1991 (abandoned), which is a Continuation of Ser. No. 07/484,466 filed Feb. 22, 1990 (abandoned), which is a Continuation of Ser. No. 07/285,292 filed Dec. 15, 1988 (abandoned), which is a Continuation of Ser. No. 06/894,432 filed Jul. 16, 1986 (abandoned), which is a Continuation of Ser. No. 06/489,986 filed Apr. 29, 1983 abandoned.

BACKGROUND OF THE INVENTION

This invention relates to thin film transistors, and more particularly to semiconductor thin film transistors having reduced photo-induced current, improved electrical contact between a transparent electrode and the source or drain region of the transistor, and reduced shorting between a source line and a gate line in a matrix array, resulting in improved liquid crystal display devices including the transistors.

The formation of a thin film transistor (hereinafter referred to as a TFT) on an insulating layer has applications to many fields. TFTs can be used in thin active matrix display panels formed on inexpensive insulating substrates, three-dimensional integrated circuits having an active element such as a transistor formed on a semiconductor integrated circuit, inexpensive, high-performance image sensors, high-density memory devices, and the like.

Thin active matrix displays utilizing TFTs typically include an upper transparent substrate, a lower transparent substrate on which the TFTs are formed and a liquid crystal material sealed between the substrates. Liquid crystal driving electrodes are arranged in the matrix of TFTs. An external selecting circuit selects some of the liquid crystal driving elements and each associated liquid crystal driving electrode is excited to display the desired letters, figures or pictures. When the TFTs are formed on an inexpensive insulating substrate and a transparent electrode of a material, such as indium oxide, tin oxide, indium-tin oxide, or the like is used as the display driving electrode, a transparent-type display panel is obtained.

Large-scale liquid crystal display devices utilizing picture elements arranged in an active matrix are currently attracting much attention. They are now being used in a variety of applications, such as small-size personal computers, hand-held televisions and the like. In such display devices using picture elements arranged in the matrix array, the use of switching elements for, in particular, planar, large scale display devices is currently being developed. When a TFT is used in an active matrix panel, each TFT controls application of the voltage of the data signals to the liquid crystal material. In order to obtain superior display performance, the TFT must have the following characteristics. (1) When the TFT is in the ON condition it must supply sufficient current to charge the capacitor. Improved display performance depends on the potential of the capacitor, which must be charged in a short period of time. (2) When the TFT is in the OFF condition, it exhibits low current leakage. This is necessary as the charge in the capacitor must be held for a period of time longer than the writing period.

When a TFT is irradiated with light, carrier density in the accumulation region is increased, due to the light. The depletion layer at the PN junction is narrowed by the increased carrier density. As a result, both ON current and OFF current are increased. The increase is OFF current is significant. In fact, the increment of leakage current caused by irradiating light is proportional to the illuminance of light. Thus, the brighter the environment is made, the more OFF current increases. While the contrast and display characteristics of a liquid crystal display device generally improves in bright light, the same light simultaneously deteriorates the TFT display performance, due to the increase in OFF current caused by light. Therefore, the TFT have this disadvantage when used in a liquid crystal display device as a switching element.

A TFT in a matrix display device commonly has a three layer electrode construction for connecting a drain electrode and a driving electrode. This construction is not fully satisfactory as the metallic layer connecting the drain and electrode can form an insulating oxide such as, for example, aluminum oxide, when an aluminum layer is used to couple the drain and the driving electrode. As a result, unwanted variations in display contrast can be caused by the insulating effect of the oxide on the contact portions. This adversely affects the display characteristics.

After the matrix array is completed, a breakdown of the insulation between lines tends to occur due to static electricity and the like. When static electricity is applied to a source line or gate line outside of the display area, poor insulation occurs at the intersection of orthogonally crossing lines. As a result of this poor insulation, a data signal can leak into a gate line or a timing signal can leak into a source line. When such a leak occurs at the intersection of the gate line and source line, it is known as a line fault. As a result, the display by every picture element connected to the affected line is adversely affected by the line fault and the display characteristics of the matrix array deteriorate substantially.

The most general method for compensating for deteriorated insulation is cutting off the source line or the gate line around the poor insulating portion. In this method, however, a line fault will inevitably occur as the elements connected to the broken source line or the broken gate line are in a non-lighting condition. In the case where a matrix array is formed on a single crystalline silicon substrate, static electricity can be avoided by providing a diode or other resistance in the silicon substrate. On the other hand, in the case where a matrix array including thin film transistors is formed on a glass substrate, poor insulation is likely to occur, because it is very difficult to provide a circuit for warding off the invasion of static electricity. As a result, the production yield of the matrix array is remarkably unsatisfactory due to poor insulation. Accordingly, there exists a need for improved thin matrix arrays and display devices, including the active matrix arrays which have reduced photo-induced current, improved electrode contact particularly in the case of transparent driving electrodes coupled to the drain by a metal which forms an insulating oxide film, and have improved insulation between the source line and gate line or the driving electrode, particularly in the case of TFT arrays formed on an insulating substrate.

SUMMARY OF THE INVENTION

Generally speaking, in accordance with the invention, a liquid crystal display device is provided which includes a plurality of picture elements arranged in a matrix on a substrate. The picture elements can include a switching element such as a thin film transistor formed on the substrate; a driving electrode for activating the liquid crystal material; and a display capacitor for storing data signals. The driving electrode and display capacitor are coupled to each other and the switching element. The display device also includes a plurality of lines, such as gate lines and source lines which can be orthogonally arranged and connected to the switching elements for providing data signals to the switching elements. The switching elements supply the data signals to the display capacitor and the driving electrode. Insulating material is provided between the crossing lines to form a matrix of crossover elements of two conductive layers with insulating material therebetween associated with each picture element.

When the switching element is a thin film transistor having a source, drain, channel and gate, one of the source or drain electrodes of the transistor can be patterned to cover the channel region of the transistor to reduce the generation of photo-induced current. The picture element driving electrode in a transparent display device should be a transparent electrode which is brought into direct contact with either the source region or the drain region of the transistor. Direct contact between the source or drain and the transparent electrode provides more stable display characteristics.

An additional layer of material can be disposed between the overlying and intersecting source lines and gate lines of the crossover element, relative to the insulating material between the gate electrode and the channel and between the two conductive portions of the display capacitor. Thus, the breakdown voltage at the crossover element can be greater than the breakdown voltage of the gate insulating layer of the thin film transistor and the insulating layer of the display capacitor. Accordingly, static electricity induced line faults, and accompanying disruption of the matrix pattern, can be substantially reduced.

Accordingly, an object of the invention is to provide an improved thin film transistor.

A further object of the invention is to provide an improved active matrix array utilizing the thin film transistors as switching elements.

Still a further object of the invention is to provide a thin film transistor having reduced photo-induced current.

Yet another object of the invention is to provide a thin film transistor having reduced current leakage when in the OFF condition.

A further object of the invention is to provide a process for forming an active matrix array utilizing thin film transistors as switching elements with improved electrical properties.

Yet another object of the invention is to provide a process for forming a liquid crystal display device including an active matrix array.

Still other objects and advantages of the invention will in part be obvious and will in part be apparent from the specification and drawings.

The invention accordingly comprises the several steps and the relation of such steps with respect to each of the others and the article possessing the features, properties, and the relation of elements which will be exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1b is a circuit diagram of a display element of the array of FIG. 1a;

FIG. 10a is a plan view of a display element that can be utilized in a matrix array of the type illustrated in FIG. 1a;

FIG. 10b is a sectional view along line 10b of FIG. 10a;

FIG. 11b is a plan view showing the intersection between the gate line and source line of FIG. 11a;

FIG. 12a is a plan view of an alternate embodiment of a display element corresponding to FIG. 11a;

FIG. 12b is a sectional view along line 12b of FIG. 12a;

DETAILED DESCRIPTION OF THE PREFERRED EMBODIMENTS

In general, an active matrix display panel for a liquid crystal device which utilizes a thin film transistor (TFT) as a switching element includes an upper transparent substrate, a lower transparent substrate on which TFTs are formed and a liquid crystal material is sealed between the substrates. Liquid crystal driving elements associated with corresponding liquid crystal driving electrodes are arranged in a matrix on the TFT array. An external selecting circuit selects some of the liquid crystal driving elements and each associated liquid crystal driving electrode is excited to display desired letters, figures or pictures.

Figure 1A:
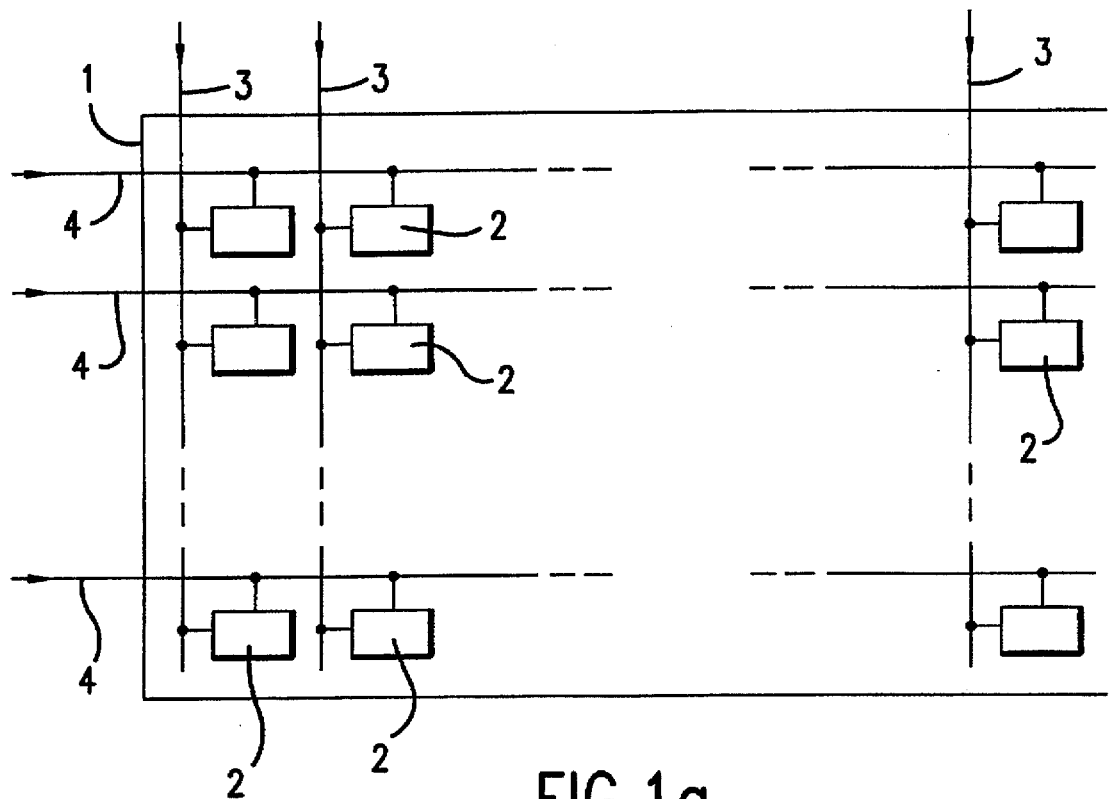
FIG. 1a is a schematic plan view of liquid crystal display elements including thin film transistors in an active matrix display panel.
Figure 1B:
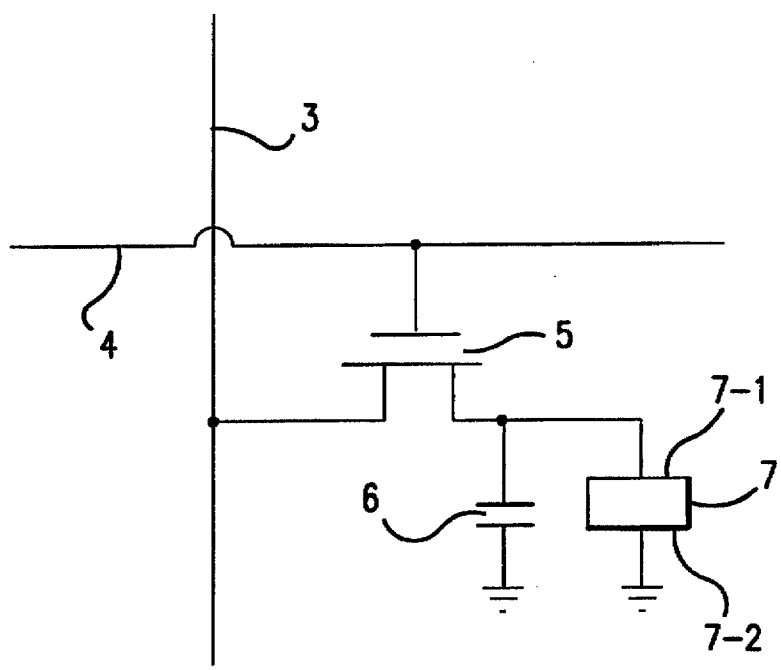

FIGS. 1a and 1b illustrate in general, liquid crystal display elements utilizing TFTs as switching elements in an active matrix display panel. FIG. 1a shows the matrix-type arrangement of liquid crystal driving elements formed on a lower substrate on which the TFTs are formed. A display region is surrounded by a boundary line 1 wherein a plurality of liquid crystal driving elements 2 are arranged in matrix format. A data signal line 3 and a timing signal line 4 are connected to each liquid crystal driving element 2.

FIG. 1b represents a detailed construction of each liquid crystal driving element 2. A liquid crystal cell 7 includes a liquid crystal driving electrode 7-1 corresponding to each liquid crystal driving element and has an opposed electrode 7-2 formed on an upper substrate. A TFT 5 controls the input of a data signal to liquid crystal cell 7. A display capacitor 6 is used for storing the data signals and it is not required if the capacitance of the liquid crystal material is large enough.

When a TFT is used as a switching element in an active matrix panel, it selects the data signal to be applied to the liquid crystal material. The TFT controls the application of data signal voltage to the liquid crystal. In order to obtain high display performance, a TFT is required to have the following characteristics:

(1) When the TFT is ON, it permits enough current to flow to charge the associated capacitor; and (2) When the TFT is OFF, it exhibits insignificant current leakage.

Requirement (1) is a necessary characteristic of a TFT with respect to the writing data applied to display capacitor 6. The quality of liquid crystal display performance depends in part upon the potential across capacitor 6. The charge also has to be rapidly stored in capacitor 6. Thus, the TFT should be able to supply enough current to completely input the data signal into capacitor 6 in a very short time. The amount of current for data writing (hereinafter referred to as ON current) is determined in compliance with the capacitance of the capacitor and the time necessary for writing the data. Accordingly, a TFT should be formed so as to supply enough ON current in accordance with the characteristics of the capacitor. The amount of ON current flowing from a TFT depends on many factors, such as, e.g. the structure, manufacturing process and size of the TFT (channel length and/or channel width), the voltage applied to the gate or drain, etc.

Requirement (2) is a necessary characteristic of a TFT relating to holding written data in a capacitor for a long time. In general, data written into a capacitor should be able to be maintained there for a longer period of time than that of the writing of that data. The capacitance of a capacitor is usually as small as approximately 1 pF. Therefore, the amount of charge stored in the capacitor is small and is easily affected by a small amount of leakage current flowing between the source and drain. In other words, if a leakage current occurs when a TFT is OFF (hereinafter referred to as OFF current), the potential at a drain where a capacitor is coupled to a TFT becomes close to the potential at the source. As a result, data written into the capacitor is not retained and the voltage drops to the voltage level of the data signal line. As a result, the signal in the capacitor cannot be properly retained in the capacitor, and image sharpness is lost. Thus, it is a significant object of the invention to reduce OFF current between the source and drain of the TFTs in the array.

When a TFT is irradiated with light, the carrier density in the accumulation region is increased, due to the light. The depletion layer at the PN junction is narrowed by the increased carrier density. As a result, both ON current and OFF current are increased. The rate of increase of OFF current is surprisingly large. In fact, as the rate of increase in leakage current is in proportion to the illuminance of the light, the brighter that the environment is made the greater the increase in OFF current. Therefore, it is disadvantageous to use a TFT in a liquid crystal display device as a switching element. While a liquid crystal display device generally takes advantage of bright light for improved contrast and superior display-characteristic, the same light simultaneously deteriorates the performance of the TFT, due to the OFF current caused by light.

Figure 2:
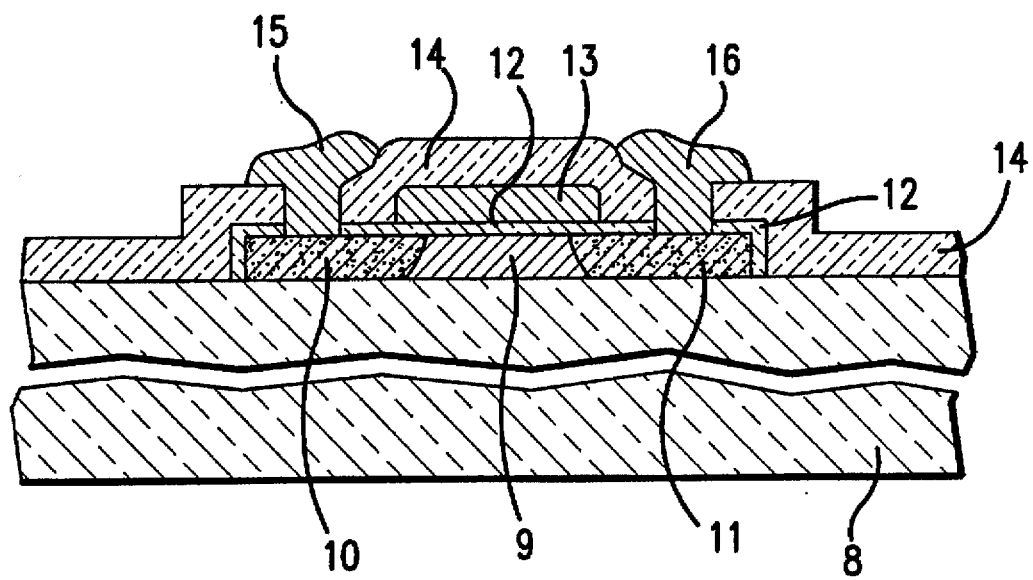
FIG. 2 is a sectional view of a thin film transistor formed on an insulating substrate.

FIG. 2 is a cross-sectional view illustrating the general structure of a conventional N-channel TFT formed on an insulating transparent substrate 8, such as glass or quartz. A semiconductor thin film 9, such as polycrystalline silicon, is formed on substrate 8. A gate insulating film 12 is formed on thin film 9. A source region 10 is formed by doping impurities such as phosphorous, arsenic, or the like, into thin film 9. A drain region 11 is formed in the same manner as source region 10. A gate electrode 13 is formed on film 12. An insulating layer 14 is disposed on gate 13 and film 12, except where a source electrode 15 and a drain electrode 16 $I_{DS}$ are formed through insulating layer 14.

Figure 3:
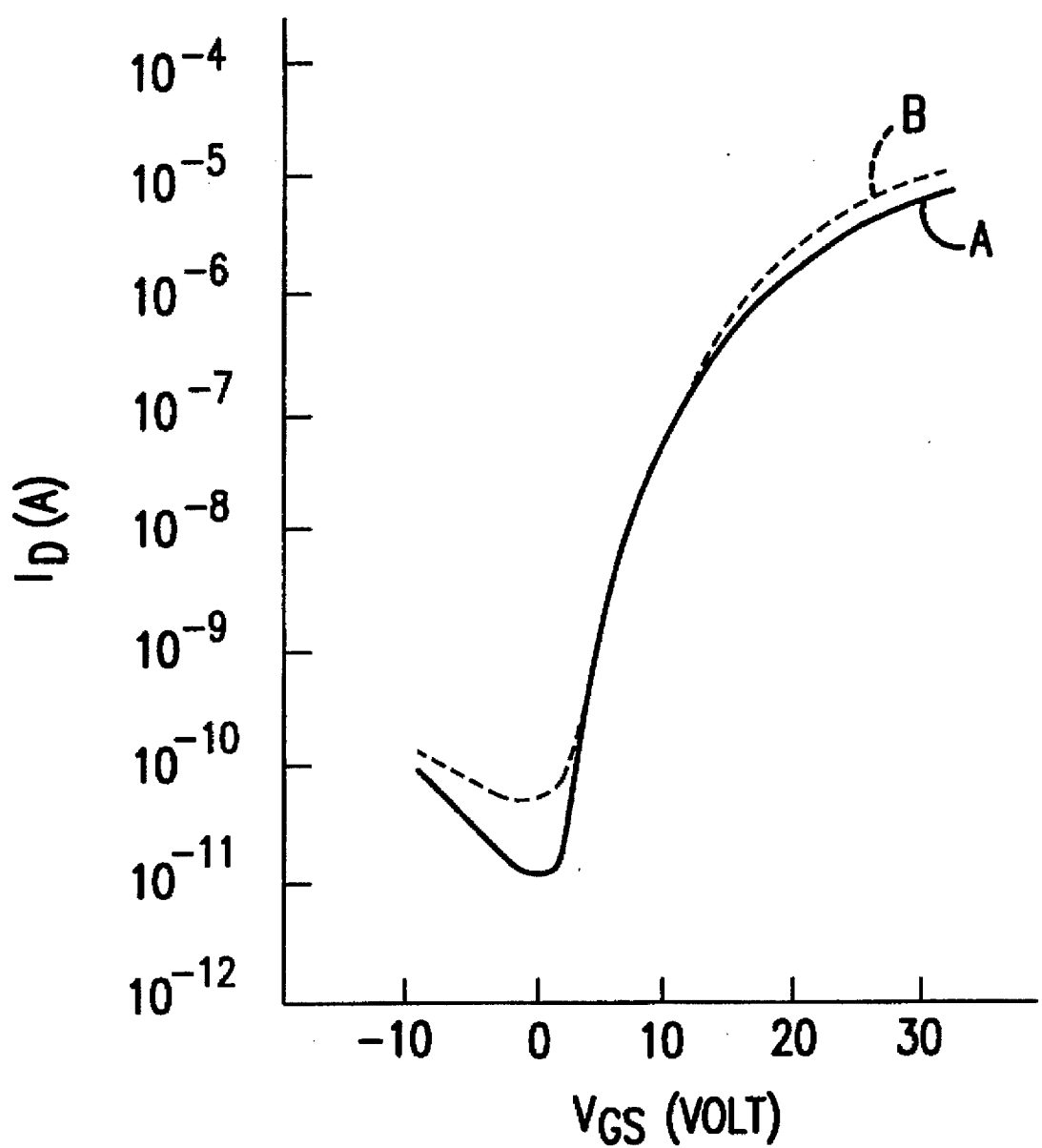
FIG. 3 is a graph illustrating the drain current and gate voltage of a transistor of FIG. 2 under a light and non-light condition.

FIG. 3 is a graph illustrating characteristics of a TFT of the construction of FIG. 2 and is based on experimental values. The abscissa represents the gate voltage to the source ($V_{GS}$) and the ordinate represents the drain current $I_{DS}$. Drain voltage to source ($V_{DS}$) and the ordinate represents drain current $I_{DS}$. Drain voltage to source ($V_{DS}$) is constant, at 4V. A solid line "A" shows drain current when there is no illumination (dark current) and a broken line "B" shows drain current under illumination of 10,000 luxes. As seen from FIG. 3, the ON current increases slightly when the TFT is irradiated, but the OFF current increases significantly. As a result, the margin of the ON current to the OFF current ratio becomes too narrow to provide the superior characteristics required of a transistor in a matrix display.

In view of this it is a significant object of this invention to provide an improved structure for a TFT wherein the photo-induced current is reduced and a matrix display is improved. In a TFT including a thin film semiconductor, having a source electrode, a drain electrode, a gate electrode, and corresponding source and drain regions, the channel region between the source and drain regions is protected from light by enlarging the source electrode and/or the drain electrode. These structures are described in detail, with reference to FIG. 4, in which the reference numerals correspond to those of FIG. 2.

Figure 4:
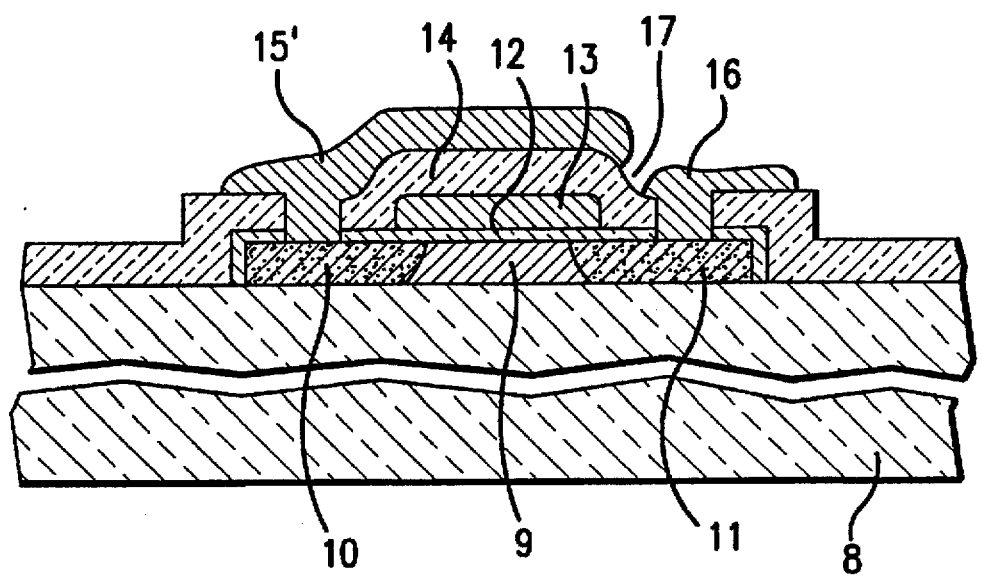
FIG. 4 is a sectional view of a thin film transistor of the invention including a patterned source electrode covering the channel region.

As shown in FIG. 4, channel region 9 between source region 10 and drain region 11 is completely shielded from light because it is covered by an extended source electrode 15'. Source electrode 15' is extended over insulating layer 14 to overlap channel 9 in plan view to block incident light from reaching channel 9. Source electrode 15 and drain electrode 16 are made of, e.g. aluminum. A space 17 occurs between electrodes 15' and 16 through which light can radiate. The width of space 17 is determined by the limitation of the patterning technique, and should be as narrow as possible. Nevertheless, light introduced through space 17 generates carriers mainly in drain region 11. This has no influence upon and would not increase the photo-induced current, because the density of doped impurity is so high that the generated carriers cannot exist for a long time and the mobility of the carriers is very poor. Accordingly, the structure as shown in FIG. 4 substantially reduces the generation of photo-induced current. The invention can also be practiced by covering channel region 9 with an extended drain electrode rather than source electrode 15'.

This construction in accordance with the invention is advantageous as either source region 10 or drain region 11 is simultaneously covered by an electrode which covers channel region 9 and light irradiates only the other region. Therefore, the photo-induced current is further reduced as compared to the case in which only the channel region is covered by a mask which interrupts the introduction of light. Moreover, TFTs can be manufactured in accordance with the invention without any special processing techniques. For instance, they can be manufactured by conventional processes which only require changing the pattern for the source electrode or drain electrode.

Figure 5:
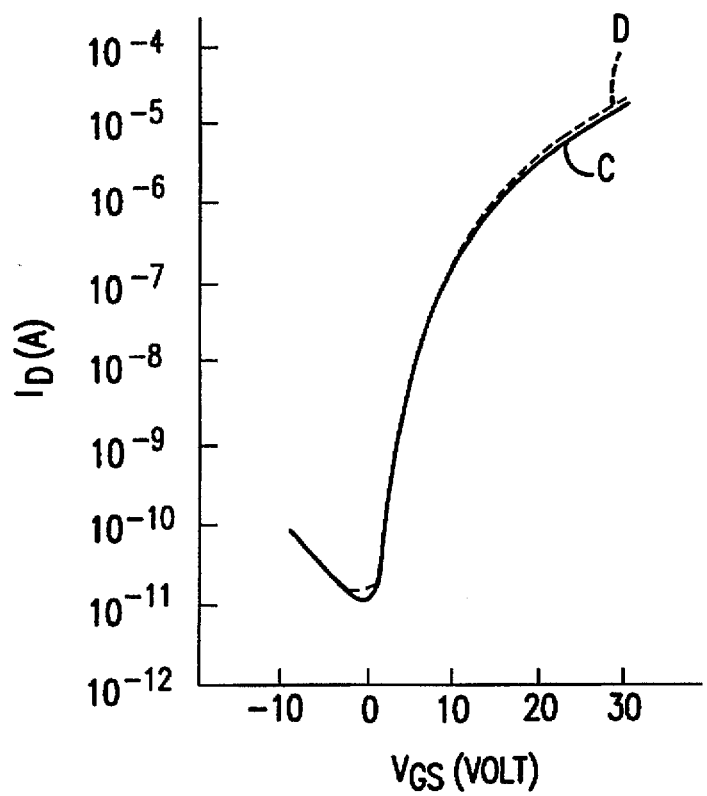
FIG. 5 is a graph illustrating the drain current and gate voltage of the transistor of FIG. 4 under a light and non-light condition.

FIG. 5 is a graph illustrating characteristics of a transistor of the type shown in FIG. 4 and is based on experimental results. The abscissa and ordinate parameters are the same as in FIG. 3. A solid line C shows drain current without light (i.e. dark current) and a broken line D shows drain current under light of 10,000 luxes. Line C corresponds to line A of FIG. 3. As shown in FIG. 5, the generated photo-induced current is very small. The amount of OFF current increases only about 1 PA under an intensive light of 10,000 luxes. This small increment in OFF current is inevitably caused by a light induced from the space between the source electrode and the drain electrode.

Figure 6:
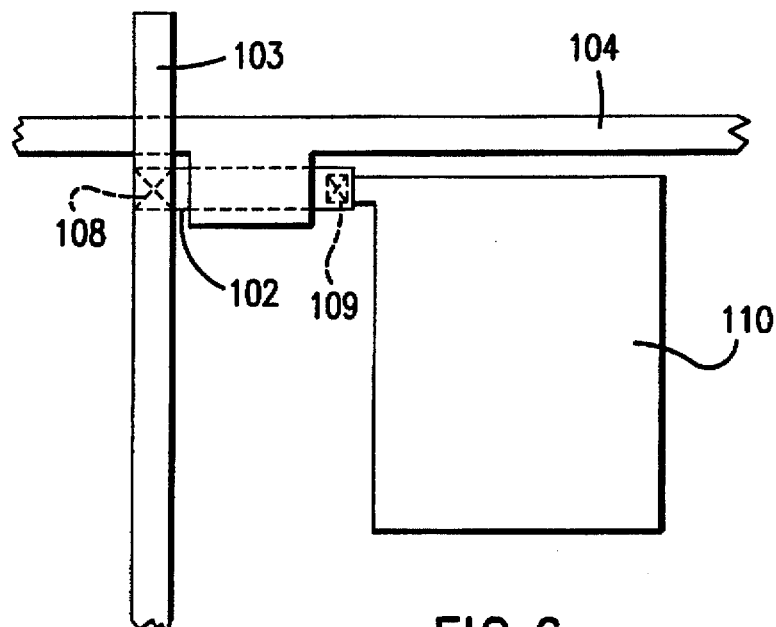
FIG. 6 is a plan view of one liquid crystal display element including a thin film transistor in an active matrix array.

FIG. 6 is an enlarged plan view of a liquid crystal display element including a TFT in an active matrix display panel of the type shown in FIG. 1a wherein the TFTs are formed on the lower substrate. Each display element includes a polycrystalline silicon layer 102. A timing signal line 104 is formed for each row of liquid crystal display elements 2 of FIG. 1 and is the scanning gate electrode portion. A data signal line 103 for each column of liquid crystal driving elements, is a signal electrode portion. Signal electrode 103 is brought into contact with polycrystalline silicon layer 102 at a contact portion 108. A display electrode 110 is connected to polycrystalline silicon layer 102 at a contact portion 109. In a transparent type liquid crystal display panel, display electrode 110 is transparent. Thus, transparent display electrode 110 should be connected to a drain electrode in polycrystalline silicon layer 102.

A conventional TFT connected to a transparent electrode is described with reference to FIG. 7. An insulating layer 202 made of polycrystalline silicon, amorphous silicon, cadmium selenide or the like is formed on an insulating substrate 201. An insulating layer 203 is formed on layer 202. A gate electrode 204 is formed on insulating layer 203. A source region 205a and drain region 205b are formed by doping impurities into insulating layer 202. A thin film of non-conductive material 206 is formed across substrate 201. Metal layers 207a and 207b are formed in contact holes in thin film 206 for interconnection to source and drain regions 205a and 205b.

Figure 7:
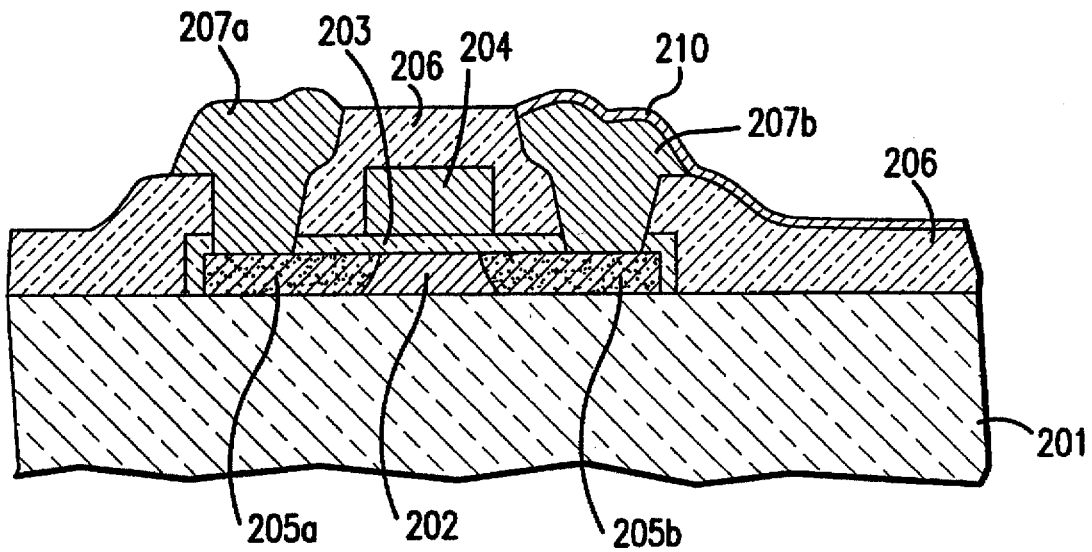
FIG. 7 is a sectional view of a thin film transistor illustrating the contact between the drain region and a transparent electrode of a display element.

The transistor of FIG. 7 has a three-layer electrode construction wherein metallic layer 207b interconnects drain region 205b and a transparent driving electrode 210, made of indium tin oxide or the like material. However, this conventional construction has disadvantageous contact characteristics. For example, if metallic layer 207b is made of aluminum, conductivity will decrease due to an insulating aluminum oxide ($Al_2O_3$) layer formed between the aluminum and transparent electrode 210. As a result, variations in display contrast are caused by the insulation which reduces the conductivity between electrode 210 and metallic layer 207b. This variation adversely affects display characteristics.

In view of this, it is also a principal object of the invention to improve the construction of a transparent type liquid crystal display device wherein a transparent electrode is connected to a drain electrode formed in a polycrystalline silicon layer. Such an improved construction with stable and excellent contact characteristics is described, by way of illustration with reference to FIGS. 8 and 9.

Figure 8:
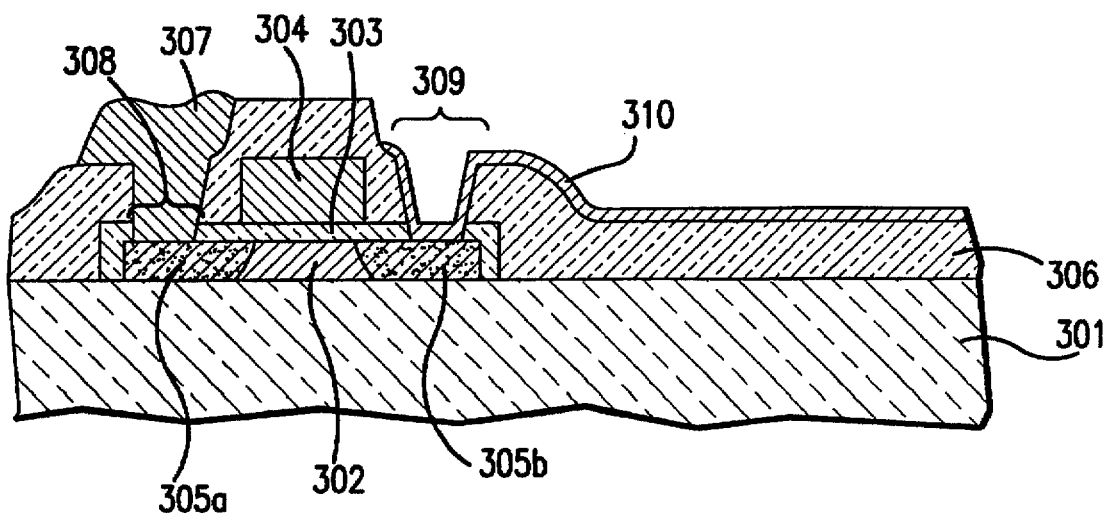
FIG. 8 is a sectional view of a thin film transistor illustrating the improved contact between the drain region and the transparent electrode in accordance with an embodiment of the invention.

In FIG. 8, a polycrystalline silicon layer 302 is formed on a transparent insulating substrate 301 and patterned to a predetermined configuration. Then, a gate insulating layer 303 is formed on polycrystalline silicon layer 302 and a gate electrode 304 is manufactured thereon. N-type impurities are doped into polycrystalline silicon layer 302 by ion implantation utilizing gate electrode 304 as a mask to form diffused regions which serve as a source region 305a and a drain region 305b of the transistor. After an insulating layer 306 is formed thereon, contact holes 308 and 309 are formed in source region 305a and drain region 305b, respectively, by photo-etching. Then, a transparent electrode 310 made of indium tin oxide or the like is formed and patterned as the driving electrode.

At this time transparent electrode 310 is brought into contact directly with drain region 305b. A signal electrode layer 307 made of aluminum or the like material is then formed for inter-connection with source region 305a. Thus, direct contact between drain region 305b and transparent electrode 310 provides stable and favorable contact characteristics. An additional advantage is that a large contact hole can be provided and the size of driving electrode 310 can be increased because opaque metal such as aluminum is not present at contact hole 309 on the side of drain region 305b. Consequently, stable and excellent contact characteristics can be provided as a result of the direct contact between the drain region in a polycrystalline silicon layer and the transparent driving electrode.

Figure 9:
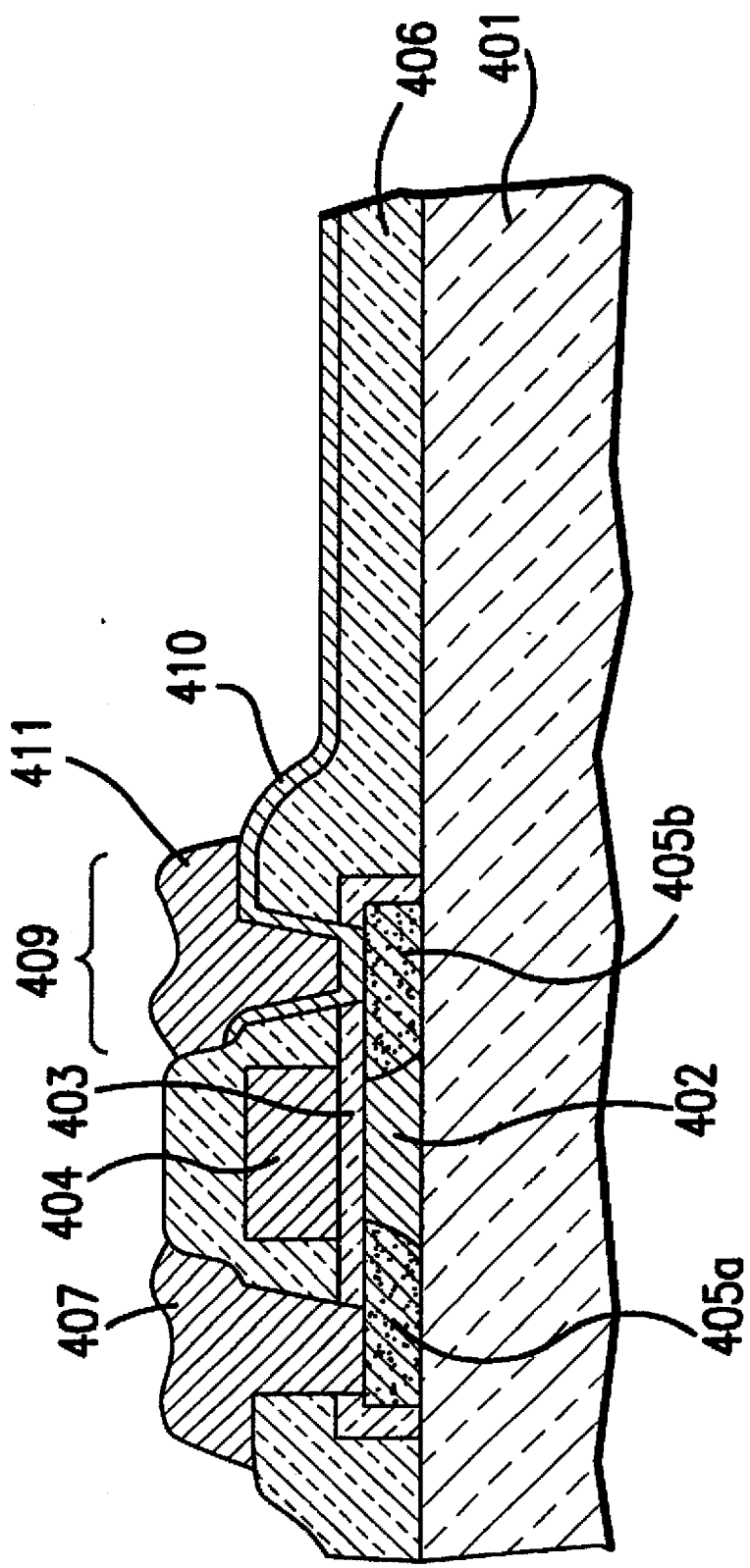
FIG. 9 is a sectional view of an alternate embodiment of FIG. 8, illustrating an additional contact with the transparent electrode.

FIG. 9 shows another embodiment of this invention with like reference numeral suffixes as used in FIG. 8 (e.g. 307-407) and is manufactured in the same manner as the transistor of FIG. 8. In the last step of manufacture of the electrode layers, a metallic layer 411, for interconnection of aluminum and the like, is provided to cover contact hole 409 between drain region 405b and transparent electrode 410. In accordance with this embodiment, even if the coverage of transparent driving electrode 410 is poor at contact hole 409, conductivity to driving electrode 410 is never cut off because of metallic layer 411 in contact hole 409 which serves as a conductor. Thus, in a transparent type liquid crystal display device utilizing transistors of the type illustrated in FIGS. 8 and 9, display contrast can be free from variations caused by poor contact characteristics between the drain region and the driving electrode.

Accordingly, this embodiment of the invention also provides an improved TFT for a transparent type liquid crystal display device having stable, improved contact characteristics between a drain electrode and a transparent electrode. In the embodiments of FIGS. 8 and 9 described herein, which are presented by way of example only, an N-type polycrystalline silicon layer on the substrate has been utilized. However, this invention can be applied to other cases, such as a P-type polycrystalline layer. Additionally, in the embodiments described herein, contact between a drain region and a transparent electrode has been described. It is contemplated within the invention that a source region can also be in contact with a transparent electrode.

When a matrix array including thin film transistors is formed on a transparent insulating substrate, such as a glass substrate, it is very difficult to provide a circuit to prevent static electricity from affecting the matrix. As a result, the production yield of usable matrix arrays is reduced substantially because of poor insulation between crossing conductive elements.

Figure 10A:
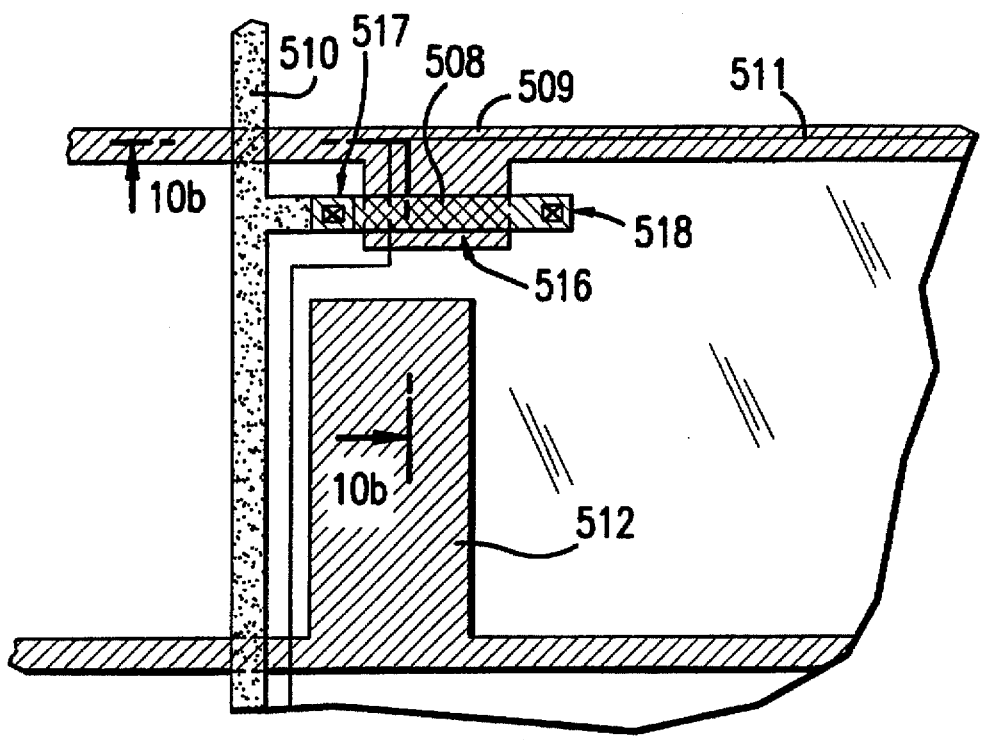
Figure 10B:
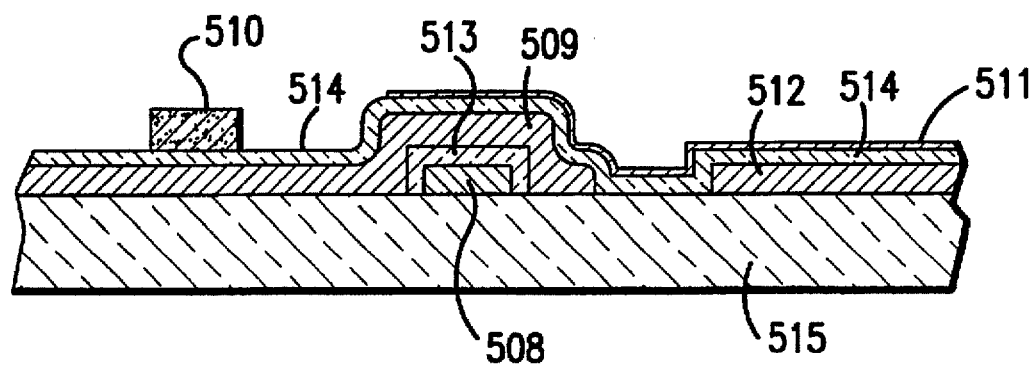

FIG. 10a is a detailed plan view of a picture element in a display device of the type illustrated in FIG. 1a. FIG. 10b is a sectional view of the picture element of FIG. 10a taken along line 10b. The picture elements include a polycrystalline silicon layer 508 formed on a glass substrate 515 with a gate insulating layer 513 formed by oxidizing the surface of polycrystalline layer 508. A second layer of polycrystalline silicon is formed and photo-etched to form a pattern thereon, thereby simultaneously forming a gate line and gate electrode 509 of a transistor 516, and one display electrode 512 of a display capacitor. Impurities are then diffused into the region of first polycrystalline silicon layer 508, except where covered with gate electrode 509, in order to form a source region 517 and a drain region 518 of transistor 516. Subsequently, an insulating layer 514 is formed over the entire surface and contact holes are formed in the region of source region 517 and drain region 518. A source line 510 and a picture element driving electrode 511 are then formed on insulating layer 514.

In transistor 516, insulating layer 514, which insulates source line 510 from gate line 509, is disposed between driving electrode 511 and display capacitor electrode 512 of the display capacitor which holds the data signal. Because the capacitance of a capacitor is in inverse proportion to the thickness of its insulating layer, insulating layer 514 should be relatively thin to provide high capacitance in the display capacitor. For example, in a case where one picture element is a square of 1 millimeter in size, the area of the display capacitor is limited to 200 $um^2$, so as not to affect the brightness of the display. If an insulating layer formed of silicon oxide has a thickness of 5,000 angstroms, the capacitance of the capacitor is only about 2.5 picofarad. In contrast, the capacitance of a liquid crystal in a picture element must be about 9 picofarad when the thickness of the liquid crystal is 10 microns.

The capacitance of the capacitor in a display element should be at least one, and preferably two to three times, as great as that of the liquid crystal. To obtain this condition, the thickness of the insulating layer should be one-fifth to one-tenth of the thickness of the liquid crystal, or the area of the display capacitor should be five times to ten times as great as that of the liquid crystal. As the area of the display capacitor is limited to maintain minimum brightness of the display panel, a reduction in thickness of the insulating layer is the only way to make the capacitance of the display capacitor larger than that of the liquid crystal material. Consequently, in this case, the silicon oxide layer should be about 1,000 angstroms or less in thickness. Even when utilizing silicon nitride having a greater dielectric constant, the thickness of the insulating layer should be limited to 1000 to 2000 angstroms.

Gate insulating layer 513 of transistor 516 usually has a thickness of at least about 1,000 to 2,000 angstroms. When the breakdown voltage of a transistor is high, insulating layer 514 is required to have a thickness of 5,000 angstroms or more. In comparing the breakdown voltages of insulating layer 514 and of gate insulating layer 513, the breakdown voltage of gate insulating layer 513 can be twice as high as that of insulating layer 514, when both layers are the same thickness. This result occurs when insulating layer 513 is thermally formed silicon oxide, while insulating layer 514 is a layer of silicon oxide deposited by chemical vapor deposition. Thus, when the thickness of gate insulating layer 513 and insulating layer 514 are between 1,000 and 2,000 angstroms, the breakdown voltage of insulating layer 514 is necessarily lower than that of gate insulating layer 513. As a result, static electricity inevitably damages a gate line or a source line at the region where the gate line and source line intersect.

Increasing the thickness of insulating layer 514, in order to ward off the damage at the intersection of a gate line and source line, causes the capacitance of the display capacitor to decrease to less than that of the liquid crystal material. In an effort to avoid this, in another embodiment in accordance with this invention, the breakdown voltage of an insulating layer is higher at the intersection between a gate line and a source line than of the display capacitor, thereby preventing line fault damage caused by static electricity, while maintaining sufficiently high capacitance of the display capacitor.

Figure 11A:
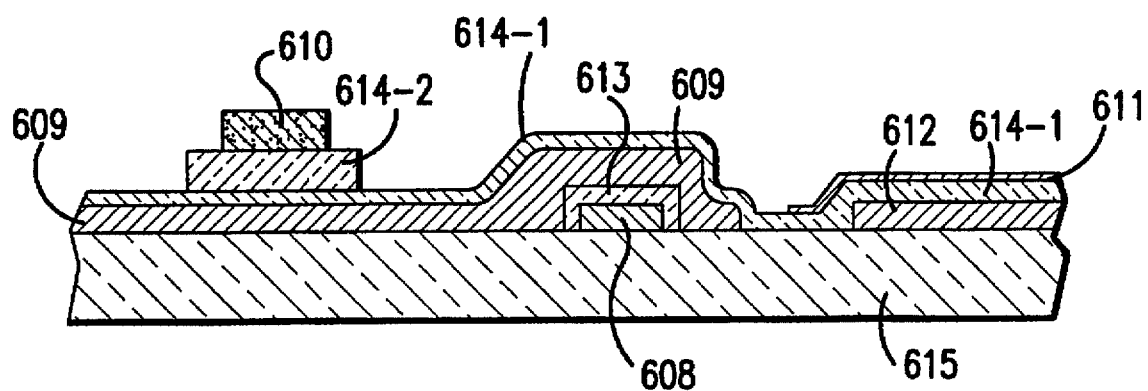
FIG. 11a is a sectional view of the same portion of a display element as in FIG. 10b, illustrating the improved insulation between the source line and gate line in accordance with the invention.

FIG. 11a is a sectional view of a display picture element on a glass substrate 615, in accordance with this embodiment of the invention.

Figure 11B:
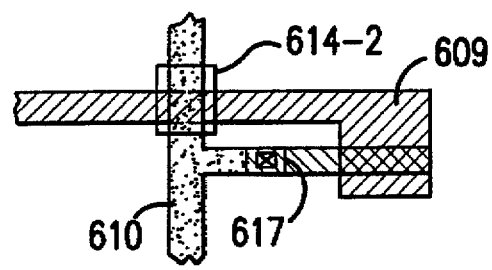

FIG. 11b is a plan view showing an intersecting portion between a gate line 609 and a source line 610 of an element in the matrix display. Corresponding elements to the element of the embodiment illustrated in FIG. 10a are designated by the same last digits in their reference numerals.

In addition to the processing steps followed for forming the insulating layer 614-1 described with respect to insulating layer 514 of FIG. 10b, a second insulating layer 614-2, such as one formed of silicon oxide is formed all over the surface of substrate 615. Then second silicon oxide layer 614-2 is removed by photo-etching, except in a region where gate lines 609 and source lines 610 intersect as shown in FIG. 11b. Subsequently, contact holes are provided in the area of the source region and drain region of first silicon oxide layer 614-1. Lastly source lines 610 are formed.

The thickness of first silicon oxide layer 614-1 is preferably 1,000 angstrom or less, which should provide sufficient capacitance in the capacitor. On the other hand, the thickness of second oxide layer 614-2 is 5,000 angstrom or more in order to raise the breakdown voltage at the intersect between gate line 609 and source line 610. Thus, the construction according to this embodiment is advantageous in that the breakdown voltage at an intersection between a gate line and a source line is higher than at the gate insulator of the transistor while maintaining the capacitance of the display capacitor sufficiently large. Furthermore, second silicon oxide layer 614-2 may be formed first and photo-etched before "first" silicon oxide layer 614-1 is formed.

When the first and second insulating layers are formed of the same material, such as silicon oxide, the thicker insulating layer which insulates gate line 609 from source line 610 is much more easily photo-etched than thinner insulating layer 614-1. Further, when insulating layer 614-1 is formed first and second insulating layer 614-2 is then formed thereon, it is preferable to form the two layers of different materials, for example, a first layer of silicon nitride and a second layer of silicon oxide, because either of these layers may be alternatively photo-etched at the time of patterning.

Figure 12A:
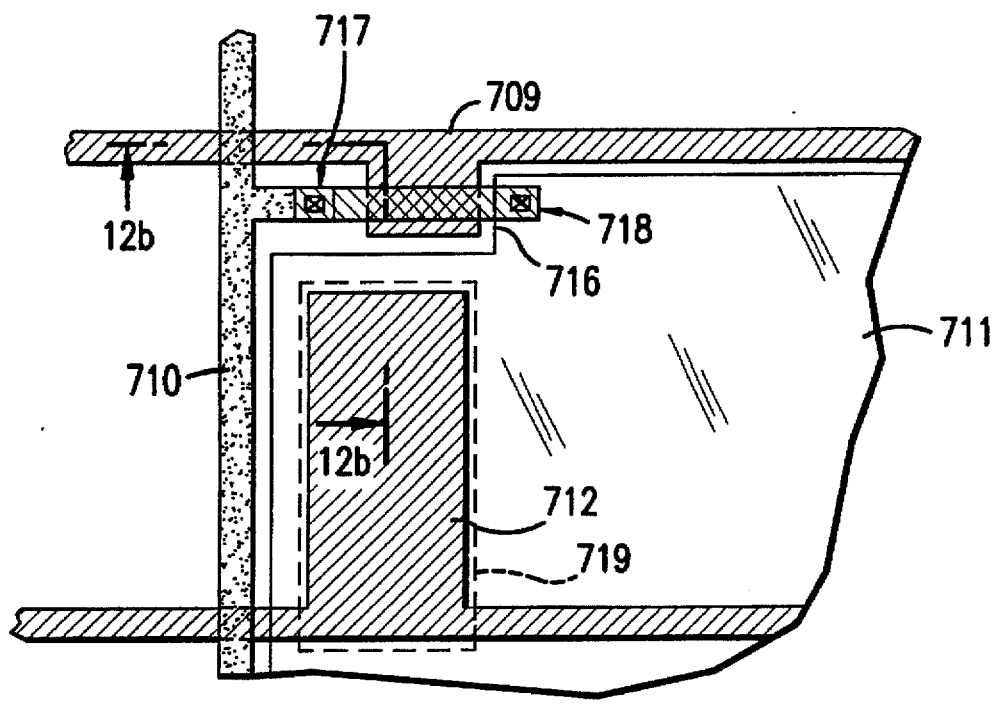
Figure 12B:
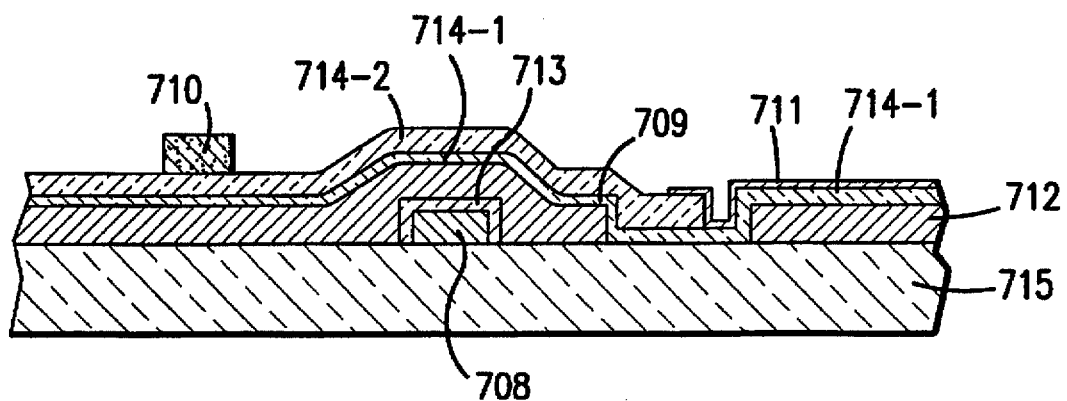

FIGS. 12a and 12b illustrate another embodiment in accordance with this aspect of the invention. FIG. 12a is a plan view of a picture element of a display device of the type illustrated in FIG. 1a and FIG. 12b is a sectional view taken along line 12b of FIG. 12a. As in the display element illustrated in FIG. 11 like elements are identified by the last two digits of the reference numerals. A thermal oxide layer 713 is formed on the surface of a thin silicon layer 708 and a second thin silicon layer 709 and 712 is formed and patterned. Impurities are diffused into first silicon layer 708, except in the region of layer 708 covered by silicon layer 709 to form a source region 717 and a drain region 718. After forming first insulating layer 714-1 and second insulating layer 714-2 subsequently, a portion of second insulating layer 714-2 in the region of capacitor electrode 712 is removed by photo-etching, resulting in only first insulating layer 714-1 on silicon layer 712. Silicon layer 712 is one electrode of the display capacitor for the picture element. Subsequently, contact holes are formed in insulating layers 714-1 and 714-2 at source region 717 and drain region 718 of transistor 716. Source line 710 and picture element driving electrode 711 are then formed.

In this embodiment, when the thickness of first insulating layer 14-1 is about 1,000 angstrom and that of second insulating layer 14-2 is about 5,000 angstroms or more, the breakdown voltage at the intersection between a source line and a gate line will be higher than that at a gate of the transistor. Furthermore, the capacitor for the picture element has sufficient capacitance. In addition, according to the embodiment of FIGS. 12a and 12b, the picture element can also be protected by thick insulating layer 714-2, which results in improved reliability. As indicated by broken line 719 about capacitor electrode 712 in FIG. 12a, the opening in thick insulating layer 714-2 may substantially conform to or surround the display capacitor. The larger the area of insulating layer 714-2 removed from over capacitor electrode 712, the greater the capacitance of the display capacitor. Insulating layers 714-1 and 714-2 are usually formed of silicon oxide. Alternatively, they can be formed of silicon nitride or aluminum oxide. In addition, the order of forming the two insulating layers can be reversed, similar to the embodiment of FIGS. 11a and 11b.

Further, the display area of driving electrode 711 can be increased to cover gate line 709 and a part of transistor 716. Therefore, the quality of image brightness is much improved. It is preferred to cover gate line 709 and a part of transistor 716 with a picture element driving electrode 711 in a construction as in FIG. 12, because thick insulating layer 714-2 contributes to diminution of faults, such as shorts. A portion of one gate line may serve as a display capacitor electrode 712.

Figure 13:
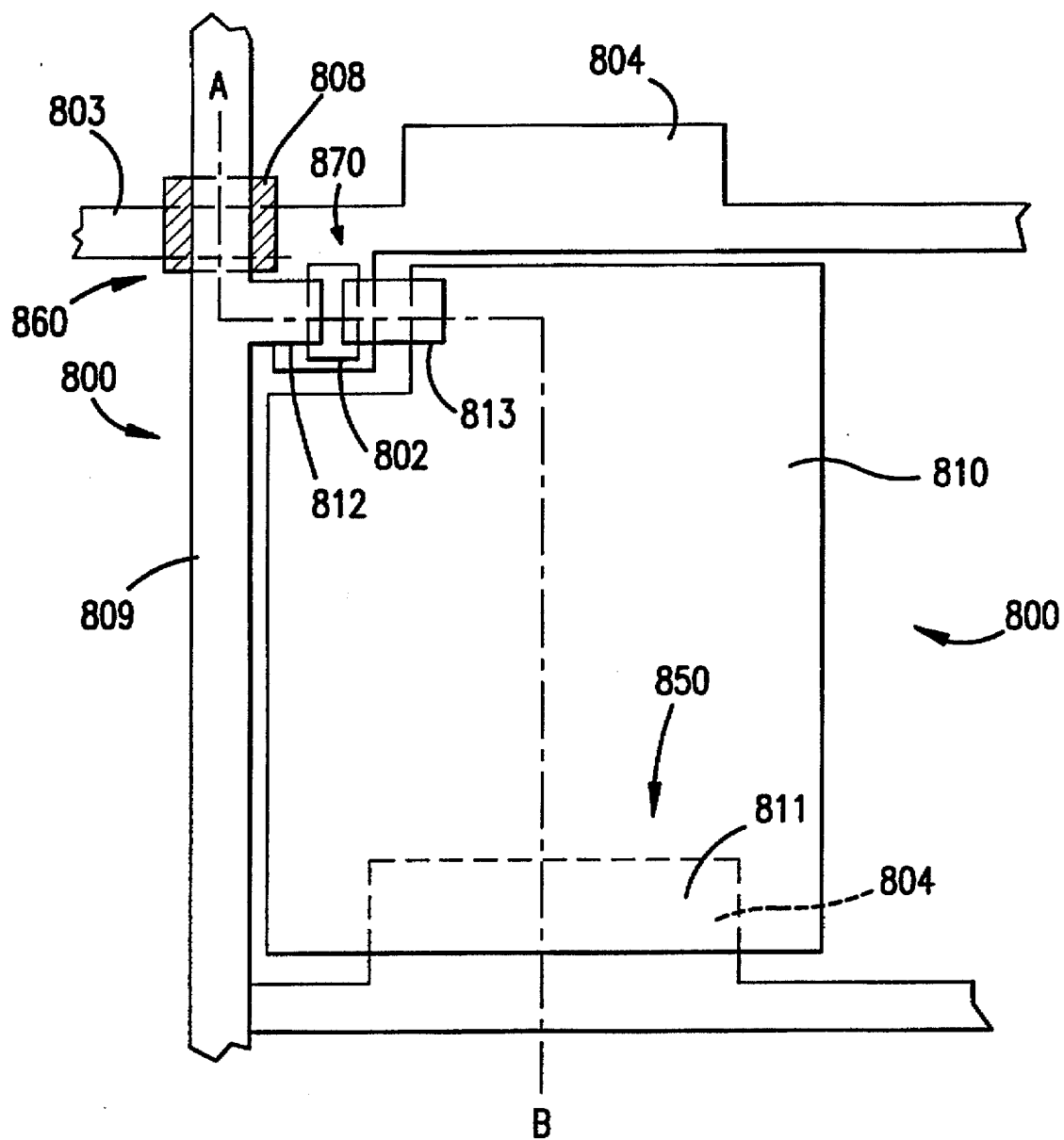
FIG. 13 is a plan view of a picture element for use in a matrix array, in accordance with an embodiment of the invention.

FIGS. 13, 14a to 14e, 15a to 15f and 16 illustrate other embodiments of the invention in which the thin film transistor is constructed with a "gate down" configuration. FIG. 13 is a plan view of a picture element 800 of a display device constructed with a matrix of picture elements 800 and FIG. 14e is a cross sectional view taken along line A–B of FIG. 13. The steps of manufacturing picture element 800 are illustrated in FIGS. 14a through 14d.

Figure 14A:
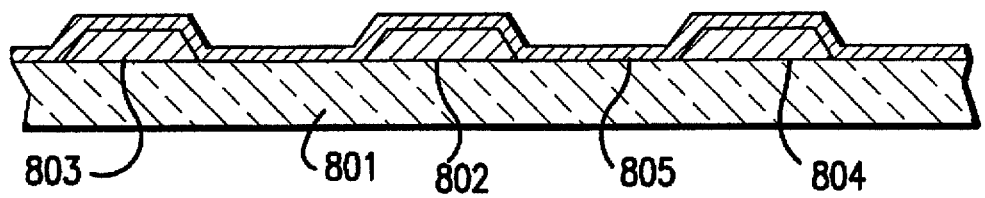
FIGS. 14a–14e are cross sectional views illustrating steps of forming a picture element in accordance with an embodiment of the invention.

Referring to FIG. 14a, a conductive thin film (not shown) is formed on a glass substrate 801 by sputtering. The conductive film is then patterned to form a gate electrode 802, a gate line 803 and a first display capacitor electrode 804, all part of a continuous layer of conductive material. However, as shown in FIG. 13, first display capacitor electrode 804 of picture element 800 is part of a layer forming a gate line 804 of a different picture element. The conductive thin film can be formed of a metal such as Ta, Cr, Al, Mo and the like; alloys of these and other metals; or laminations of these metals and the like.

As shown in FIG. 14a, a gate insulating film 805 is then formed over the surface of substrate 801 and over gate line 803, gate electrode 802 and first display capacitor electrode 804. Gate insulating film 805 can be a single film, a multi-layer film or a lamination of insulating materials. It can be formed by subjecting gate electrode 802 to anodic oxidation and then depositing an additional layer of insulating material thereon and over the substrate by Chemical Vapor Deposition (CVD) or sputtering. Gate insulating film 805 can also be formed by depositing a single layer of non-conductive material, such as a silicon nitride film or a silicon oxide film or combinations thereof. Gate insulating film 805 can also be formed by depositing a single layer of non-conductive material, such as a silicon nitride film or a TaOx film or a multi-layer thereof.

Figure 14B:
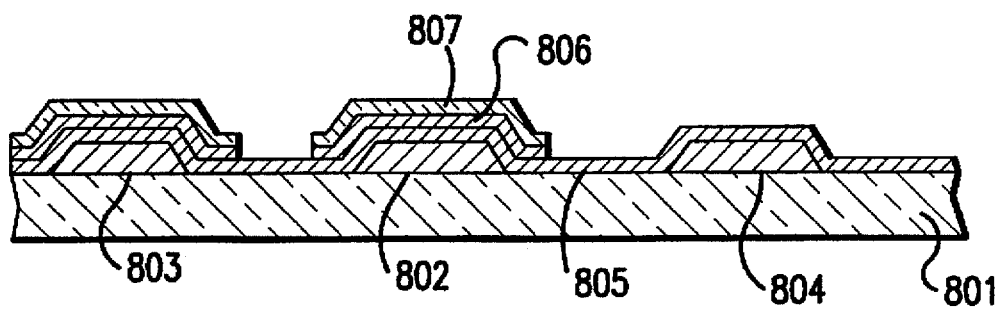

Referring to FIG. 14b, a film of non-doped semiconductor material, such as amorphous silicon, is deposited over substrate 801 and patterned to form a non-doped semiconductor film 806 over gate electrode 802 and over gate line 803. An impurity-doped semiconductor film such as a film of $N^+$ amorphous silicon is then laminated over substrate 801 and patterned to form impurity-doped semiconductor film 807 over non-doped film 806. Films 806 and 807 can be patterned individually or simultaneously. The thickness of non-doped semiconductor film 806 should be about 100 to 400 nm and the thickness of impurity-doped semi-conductor film 807 should be about 30 to 100 nm.

A layer of insulating material is then formed over the surface of substrate 801 and patterned to form an insulating film 808 in at least the region over gate line 803, where gate line 803 will be crossed by a source line 812. The formation of source line 812 is described below with reference to FIG. 14d. Insulating film 808 can be formed by depositing a film of silicon oxide, silicon nitride and the like, by Chemical Vapor Deposition or sputtering.

Figure 14C:
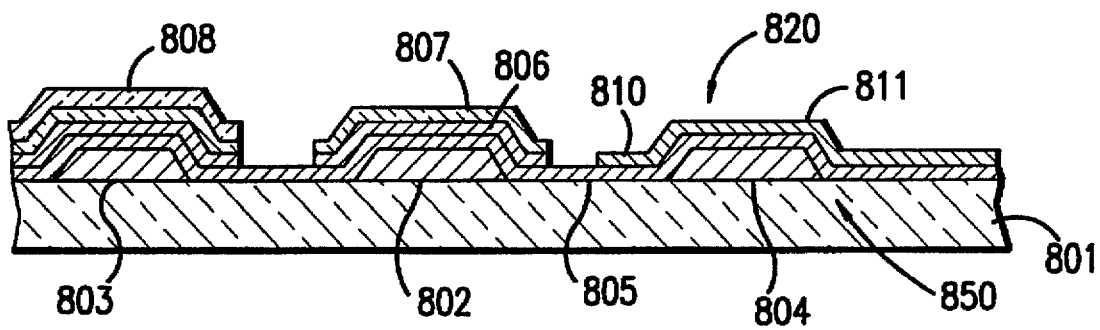

As also shown in FIG. 14c, a layer of conductive material is deposited over substrate 801, on gate insulating film 805, to form a picture element electrode 810 and a second display capacitor electrode 811. These layers can be formed of a film of transparent conductive material, such as ITO and are located over a portion of gate insulating film 805 and first display capacitor electrode 804. In this manner, a display capacitor 850, having a display capacitance, is formed from the first and second display capacitor electrodes 804 and 811 with gate insulating film 805 therebetween. After these functional elements of picture element 800 are completed, an insulating film 815 is disposed over the entire surface.

In this embodiment, the layer forming the gate line of the picture element positioned below picture element 800 in FIG. 13 is used as one of the display capacitor electrodes. However, in an alternate configuration, the source line of an adjacent picture element or the gate line from an upper gate line, or an other conductive layer can be used.

In one embodiment of the invention, gate insulating film 805, non-doped semiconductor film 806, impurity-doped semiconductor 807 and insulating film 808 are laminated and patterned individually. However, two or all of these films may be laminated successively and then patterned simultaneously.

Figure 14D:
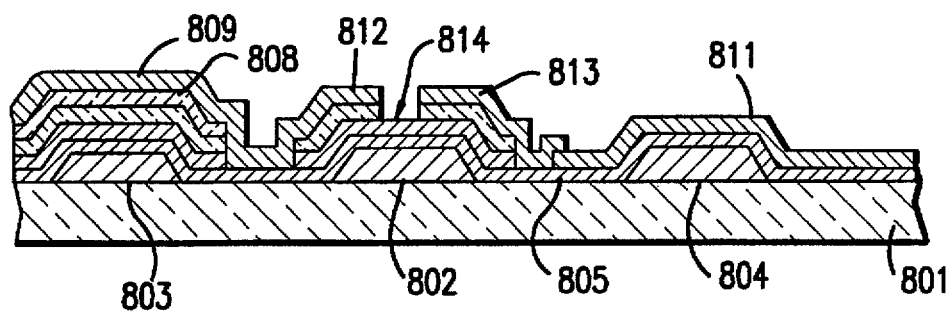
Figure 14E:
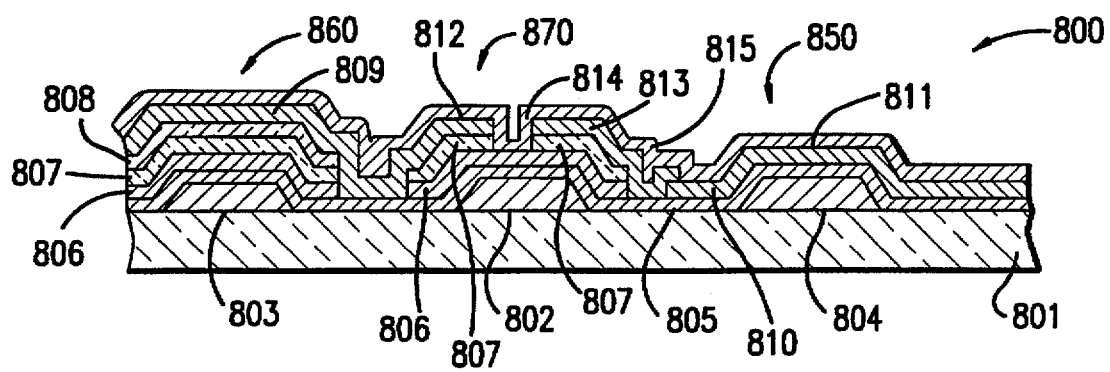

Referring to FIG. 14d, a conductive layer, such as an aluminum layer, is laminated over the substrate to form a source electrode 812, a source line 809 and a drain electrode 813. A thin film transistor element 870 is then completed by forming a channel region 814 in non doped semiconductor layer 806 by etching an opening in both the conductive layer for forming source and drain electrodes 812 and 813 and doped silicon layer 807 in a region over gate electrode 802. The portion of doped semiconductor film 807 over gate electrode 802 acts as the source region and drain region of transistor 870. A capacitive crossover element 860 is formed by gate line 803 and source line 809, with layers 806, 807 and 808 therebetween. A protective film 815 is then formed over the whole surface, as shown in FIG. 14e, to form picture element 800.

The materials that can be used for the conductive film used to form source electrode 812 and drain electrode 813 include aluminum, chromium, tantalum, a metal alloy of two or three of these or a lamination of two or three of these materials. In a preferred embodiment, insulating film 808 is formed prior to forming picture element electrode 810 and display capacitor electrode 811. Insulating film 808 may be formed at any time after gate line 803 has already been formed, and before source line 809 has been formed. Gate insulating film 805 acts as the insulating film of display capacitor 850. Therefore, a sufficient capacitance can be obtained for display capacitor 850.

An electro-optical display constructed in accordance with the invention can include a matrix of picture elements 800, each including display capacitor 850, thin film transistor 870 and crossover element 860 at intersections of source lines 809 and gate lines 803. At crossover 860, the insulating films such as insulating films 805, 806 and 808 are positioned between source line 809 and gate line 803. Therefore, the thickness of the insulating material between source line 809 and gate line 803 at crossover 860 is thicker than the insulating material at display capacitor 850. These layers of insulating material are effective for providing a sufficiently high breakdown voltage between gate line 803 and source line 809 to significantly reduce problems associated with line faults.

Although impurity doped semiconductor film 807 is not an insulating film, it is effective for increasing the breakdown voltage at crossover 860 for the following reason. During the various patterning operations for forming picture element 800, a resist mask and etching solutions are used. If there are any pin holes in the resist masks, the etching solutions can permeate the various insulating films, such as to gate insulating film 805 and reduce the thickness of gate insulating film 805. This would lead to a decrease in breakdown voltage at crossover 860. However, impurity doped semiconductor film 807 functions as an etching solution stopper and thus, helps prevent any etching solution from permeating to and deteriorating gate insulating film 805. Thus, including doped film 807 between source line 804 and gate insulating film 805 can increase the breakdown voltage of crossover 860 compared to a construction in which it is not interposed and it can increase the breakdown voltage relative to display capacitor 850.

Accordingly, as described above, it is possible to achieve a picture element 800 having a higher breakdown voltage at crossover 860 compared to the breakdown voltage across gate insulating film 805 of thin film transistor 870 and display capacitor 850 by including any of films 806, 807 and 808 between gate line 803 and source line 809.

Figure 15A:
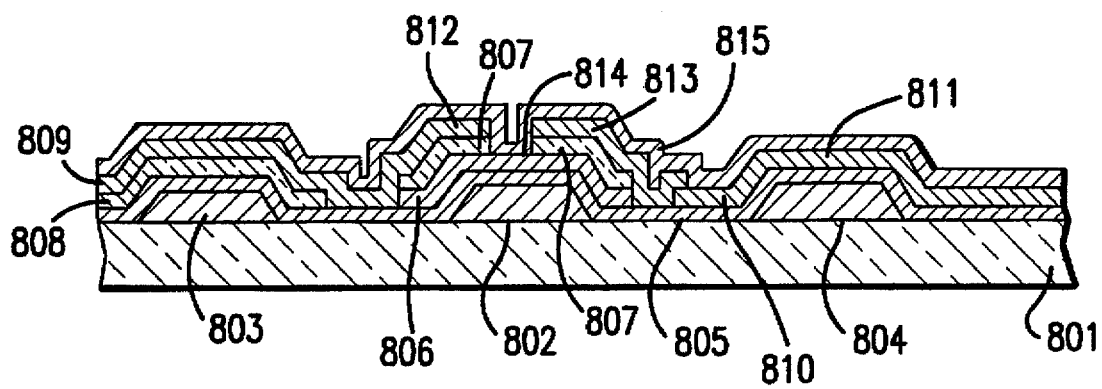
FIGS. 15a through 15e are cross sectional views of picture elements formed in accordance with embodiments of the invention.

Other embodiments of a picture element including a crossover, a thin film transistor and a display capacitor, constructed in accordance with embodiments of the invention are shown in FIGS. 15a through 15e, with similar elements being assigned the same reference numerals. In each of these constructions, the breakdown voltage between gate line 803 and source line 809 is greater than across the display capacitor of those constructions. For example, as shown in FIG. 15a, both of impurity doped semiconductor film 807 and non-doped semiconductor 806 can be simultaneously removed from the region which will be between source line 809 and gate line 803, at the time of patterning impurity doped semiconductor film 807 and non-doped semiconductor film 806. The inclusion of both gate insulating film 805 and insulating film 808 leads to the increase in breakdown voltage.

Figure 15B:
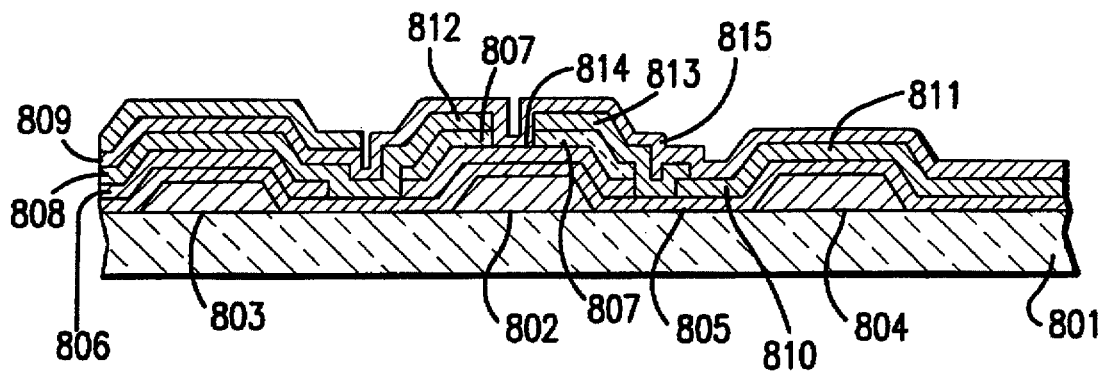

As shown in FIG. 15b, impurity doped semiconductor film 807 can be removed at the intersection of source line 809 and gate line 803. The combination of non-doped semiconductor film 806 and gate insulating film 805 will lead to suitable breakdown voltage. However, when impurity doped film 807 is removed as shown in FIG. 15b, it should be laminated and patterned after non-doped semiconductor film 806 is laminated and patterned. The inclusion of both gate insulating film 805 and insulating film 808 leads to the increase in breakdown voltage.

Figure 15C:
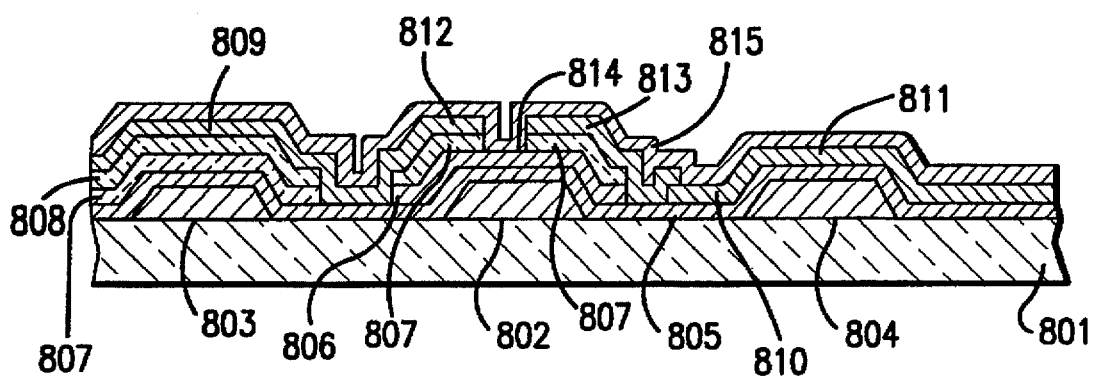

As shown in FIG. 15c, non-doped film 806 can be removed from between gate line 803 and source 809. If non-doped semiconductor film 806 is removed as shown in FIG. 15c, impurity doped semiconductor film 807 should be laminated and patterned after non-doped semiconductor film 806 is laminated and patterned. The combination of insulating film 808, doped film 807 and gate insulating film 805 will provide sufficient breakdown voltage at the crossover.

Figure 15D:
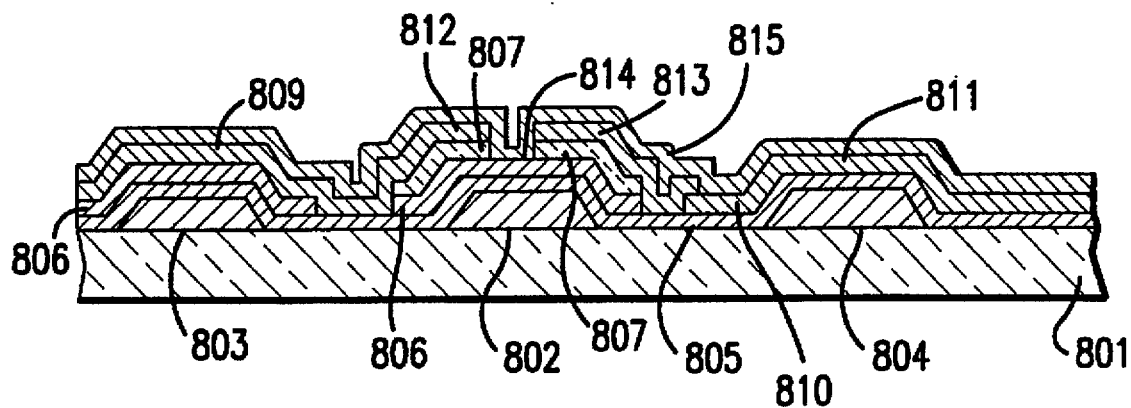
Figure 15E:
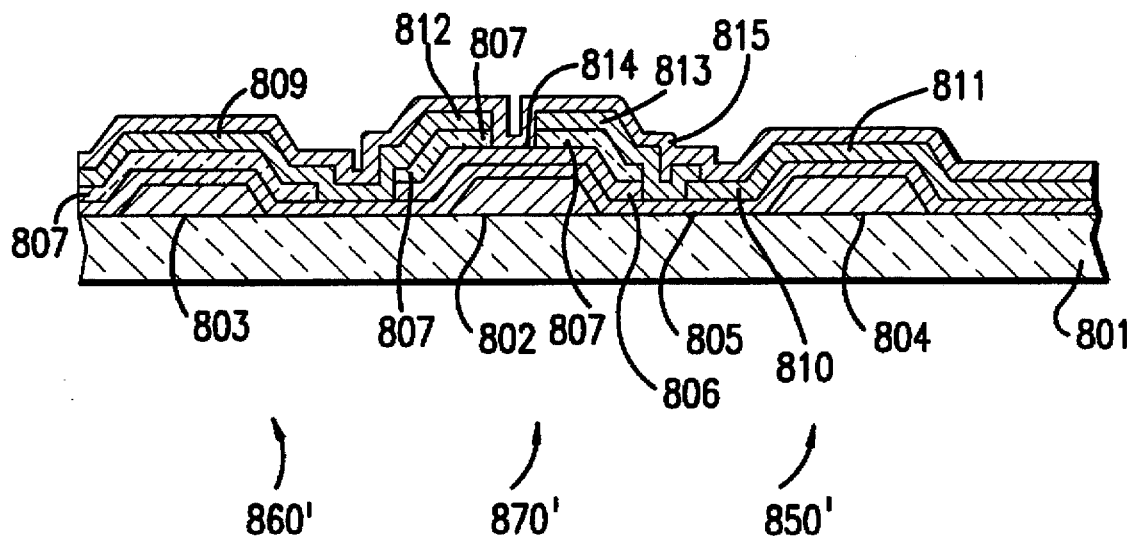

As shown in FIG. 15d, non-doped semiconductor film 806 can be provided on gate insulating film 805 at the intersection of source line 809 and gate line 803, without forming insulating film 808. Furthermore, as shown in FIG. 15e, impurity doped semiconductor film 807 can be laminated at the intersection of source line 809 and gate line 803, without also forming insulating film 808. The combination of non-doped film 806 (FIG. 15d) or doped film 807 (FIG. 15e) with gate insulating film 805 will provide the relative increase in breakdown voltage.

In the configurations shown in face 15a–15e, it is possible to increase the breakdown voltage at the crossover compared to the breakdown voltage across gate insulating film 805 of a transistor 870' and a display capacitor 850' because at least one additional layer of material is included between source line 809 and gate line 803, in addition to gate insulating film 805. Gate insulating film 805 is the only layer of insulating material at transistor 870' and display capacitor 850'.

Figure 16A:
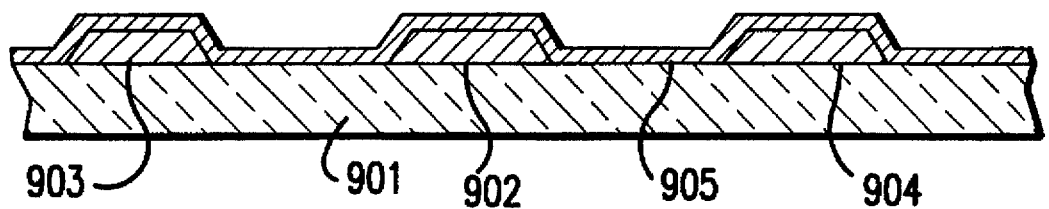
FIGS. 16a through 16f are cross sectional views illustrating the steps of forming a picture element in accordance with an embodiment of the invention.
Figure 16B:
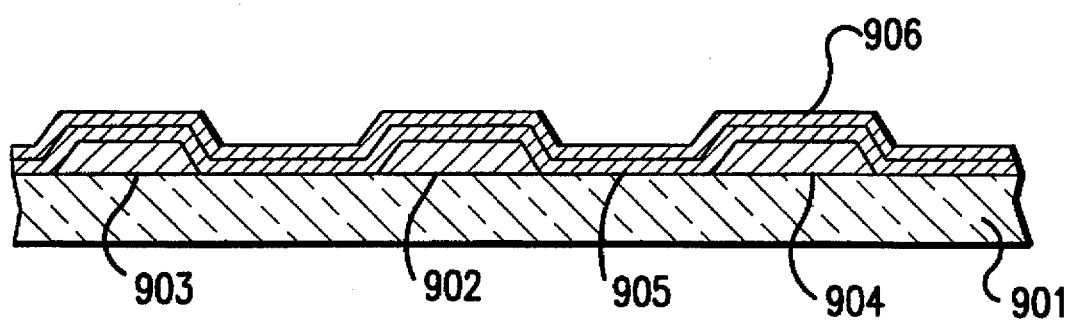
Figure 16C:
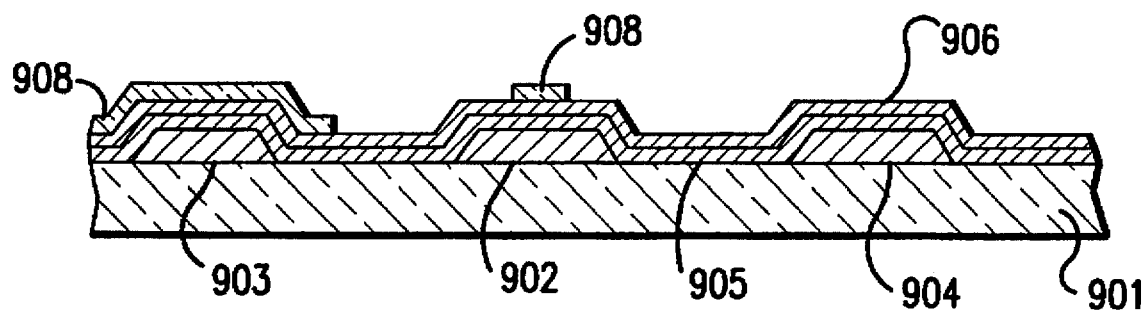
Figure 16D:
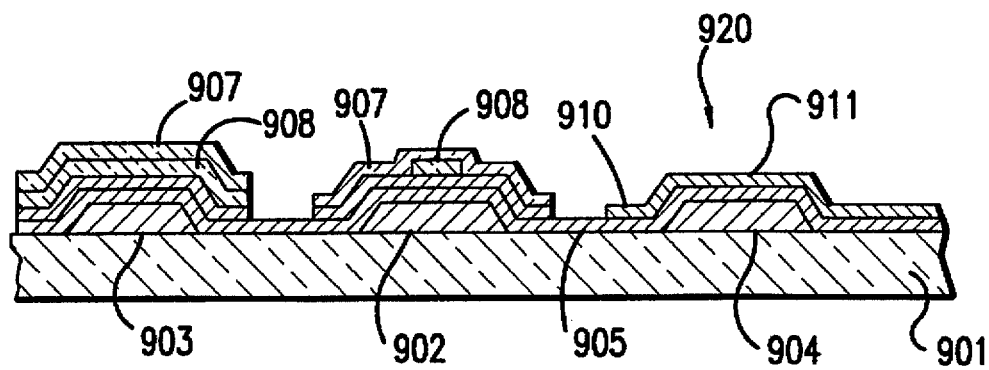
Figure 16E:
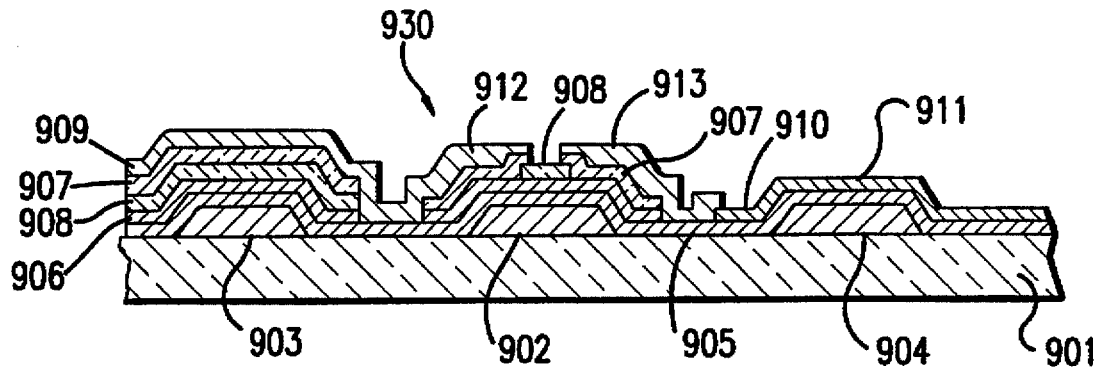
Figure 16F:
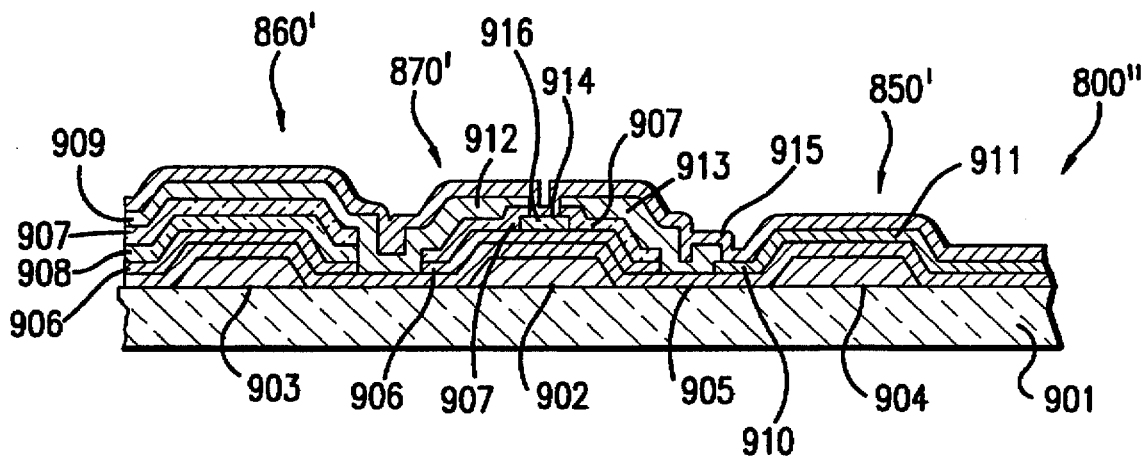

Additional steps for forming a picture element 800" in accordance with an embodiment of the invention having the "gate down" configuration are shown in FIGS. 16a to 16f. FIG. 16f is a cross section of picture element 800", which corresponds to the configuration shown in the FIG. 13, taken along line A–B.

Referring to FIG. 16a, a conductive thin film is formed on a glass substrate 901. The conductive film is then patterned to form a gate electrode 902, a gate line 903 and a first display capacitor electrode 904. The conductive thin film can be formed of a metal such as tantalum, chromium, aluminum, molybdenum and the like; metal alloys thereof; or a lamination of two or more of these metals.

A gate insulating film 905 is then formed over the surface of substrate 901. Gate insulating film 905 can be in the form of a single or multi-layer or a lamination of insulating films. It can be formed by first subjecting gate electrode 902 to anodic oxidation and then depositing a layer of insulating material by chemical vapor deposition.

Referring to FIG. 16b, a non-doped semiconductor film 906 is laminated over substrate 901. Non-doped semiconductor film 906 can be formed of amorphous silicon and can have a thickness from about 100 to about 400 nm.

Referring to FIG. 16c, portions of non-doped semiconductor film 906 can be removed, to yield discontinuous portions thereof over gate line 903 and gate electrode 902, with no portion over capacitor electrode 904. An insulating film 908 is then laminated over the surface of substrate 901 and patterned to be over gate electrode 902 and gate line 903. In a transistor 870" of FIG. 16f, insulating film 908 overlaps gate line 903 completely, but does not completely overlap gate electrode 902.

Referring to FIG. 16d, an impurity doped semiconductor film 907 is laminated over the substrate and patterned to cover insulating film 908. Impurity doped film 907 can be $N^+$ amorphous silicon. Subsequently, a layer of conductive material 920, preferably a transparent conductive film such as ITO, is deposited to form a picture element electrode 910 over the substrate and a second display capacitor electrode 911 over the first display capacitor electrode with gate insulating film 905 therebetween. As shown in FIG. 16e, a conducive layer 930 is then laminated and patterned to form a source electrode 912 on doped layer 907, over gate electrode 902, a source line 909 coupled to source electrode 912, and extending over gate line 903 and a drain electrode 913 coupled to picture element 910. The portion of doped layer 907 over gate electrode 902 is also removed to form a source region and a drain region in doped layer 907. Source electrode 912 is coupled to the source region of layer 907 and drain electrode 913 is coupled to the drain region.

In the embodiment of FIG. 16f, insulating film 908 also serves as an etching stopper 916 at transistor 870". Finally, as shown in FIG. 16f, a protective film 915 is formed over the surface of substrate 901.

In different embodiments of the invention, one or two of non-doped semiconductor film 906, impurity doped semiconductor film 907 and insulating film 908 can be removed from a crossover location 860" between the intersection of source line 909 and gate line 903. When non-doped semiconductor film 906 is removed, insulating film 908 should be laminated after non-doped semiconductor film 906 is laminated and patterned. An insulating film can also be formed on impurity doped semiconductor film 907. In this embodiment, impurity doped semiconductor film 907 and the overlying insulating film can be laminated and then patterned simultaneously.

As discussed above, the layer forming gate insulating film 905 can be the same layer of material forming the insulating film of display capacitor 850" Therefore, the thickness of the material between source line 909 and gate line 903 at crossover 860" is thicker than the insulating material at display capacitor 850". Therefore, it is possible to achieve superior breakdown voltage at crossover 860" relative to the breakdown voltage across insulating film 905 at thin film transistor 870" and display capacitor 850". In various embodiments of the invention, one, two or all three of gate insulating film 905, non-doped semiconductor film 906 and insulating film 908 can be in turn laminated and simultaneously patterned.

The embodiments shown in FIGS. 14e and 16f are preferably included in a matrix array including thin film transistors formed on an insulating substrate, such as a glass substrate. The embodiments of FIGS. 14e and 16f are different from the embodiments of FIGS. 11a and 12b in that gate electrodes 802 and 902 are formed "below" the channel region instead of "above" of the channel region when the substrate is considered to be the "bottom". However, these embodiments can be formed to have the same total thicknesses of insulating films and conductive films as the embodiments shown in FIGS. 11a and 11b. The thickness of the material between source lines and gate lines can be made to be greater than the thickness of the insulating films of the other regions, such as at the gate of the thin film transistor and the insulating layer of the display capacitor. Accordingly, the same advantages can be obtained and these embodiments can have the same scope of utility.

As described above, according to this invention, the breakdown voltage at an intersection between a source line and a gate line can be higher than that of a gate insulator of a transistor by forming the insulating material thicker in the region where the source line and the gate line intersect than at other regions. The damage to a matrix array caused by static electricity can be limited to involve only a picture element fault, not a line fault. Accordingly, production yields of matrix arrays are improved, permitting economic mass production. In addition, the capacitance of the display capacitor is increased to provide an improved matrix array with respect to the charging characteristics of a data signal. As a result, the display characteristic of a display device utilizing such a matrix array is improved.

In the embodiments described herein, a matrix array wherein the capacitor electrode is independently provided, has been described, but the invention is intended to be applicable to a matrix array wherein one electrode of the capacitor and the gate line of the adjacent picture element thereof are in common. Thus, improved thin film transistors and active matrix liquid crystal display panels utilizing the transistors as switching elements having reduced photo-induced current, improved electrode contact and increased resistance to static electricity are provided.

It will thus be seen that the objects set forth above, among those made apparent from the preceding description, are efficiently attained and, since certain changes may be made in carrying out the above process, in the described product, and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A liquid crystal device, comprising:

a pair of opposed and spaced apart insulating substrates;

a plurality of source lines and a plurality of gate lines disposed on one of the substrates, the source lines intersecting the gate lines at cross-over locations;

a plurality of layers located between each of the source lines and each of the gate lines at the cross-over locations, the plurality of layers having non-coextensive edges near the cross-over locations;

a plurality of switching elements coupled to the source lines and the gate lines; and a plurality of capacitors including an insulating film which functions as a dielectric material of the capacitors, one of the plurality of layers of the cross-over locations being the insulating film extending from the cross-over locations to the plurality of capacitors, wherein a breakdown voltage of the plurality of layers at each of the cross-over locations is greater than a breakdown voltage of the insulating film of each of the capacitors.

2. The liquid crystal device of claim 1, wherein one of the plurality of layers is one of polycrystalline silicon and amorphous silicon.

3. The liquid crystal device of claim 1, wherein one of the plurality of layers includes at least one non-conductive material selected from the group consisting of a film of SiN, a film of SiO$_2$, a film of TaOx, a film formed by anodic oxidation of Cr, Ta, Mo, Al and alloys thereof.

4. The liquid crystal device of claim 1, wherein one of the plurality of layers is at least one of a non-doped semiconductor and an impurity-doped semiconductor film.

5. The liquid crystal device of claim 1, wherein the plurality of layers include two non-conductive layers.

6. The liquid crystal device of claim 1, wherein the insulating film of the capacitors includes at least one of a silicon nitride layer and a silicon oxide layer.

7. The liquid crystal device of claim 1, wherein the insulating film of the capacitors includes at least one of a TaOx layer and a silicon nitride layer.

8. A liquid crystal device, comprising:

a pair of opposed and spaced apart insulating substrates;

a plurality of source lines and a plurality of gate lines disposed on one of the substrates, the source lines intersecting the gate lines at cross-over locations;

a plurality of layers located between each of the source lines and each of the gate lines at the cross-over locations, the source and gate lines being completely separated by the plurality of layers;

a plurality of switching elements arranged near the cross-over locations and coupled to the source lines and the gate lines; and a plurality of capacitors including an insulating film which functions as a dielectric material of the capacitors, one of the plurality of layers of the cross-over locations being the insulating film, wherein a breakdown voltage of the plurality of layers at each of the cross-over locations is greater than a breakdown voltage of the insulating film of each of the capacitors.

9. The liquid crystal device of claim 8, wherein one of the plurality of layers is one of polycrystalline silicon and amorphous silicon.

10. The liquid crystal device of claim 8, wherein one of the plurality of layers includes at least one non-conductive material selected from the group consisting of a film of SiN, a film of $SiO_2$, a film of TaOx, a film formed by anodic oxidation of Cr, Ta, Mo, Al and alloys thereof.

11. The liquid crystal device of claim 8, wherein one of the plurality of layers is at least one of a non-doped semiconductor and an impurity-doped semiconductor film.

12. The liquid crystal device of claim 8, wherein the plurality of layers include two non-conductive layers.

13. The liquid crystal device of claim 8, wherein the insulating film of the capacitors includes at least one of a silicon nitride layer and a silicon oxide layer.

14. The liquid crystal device of claim 8, wherein the insulating film of the capacitors includes at least one of a TaOx layer and a silicon nitride layer.

15. A liquid crystal device, comprising:

a pair of opposed and spaced apart insulating substrates;

a plurality of source lines and a plurality of gate lines disposed on one of the substrates, the source lines intersecting the gate lines at cross-over locations;

a plurality of layers located between each of the source lines and each of the gate lines at the cross-over locations;

a plurality of switching elements arranged near the cross-over locations and coupled to the source lines and the gate lines; and a plurality of capacitors electrically coupled to the switching elements, each of the capacitors including an insulating film which functions as a dielectric material of the capacitors, wherein a breakdown voltage of the plurality of layers at each of the cross-over locations is greater than a breakdown voltage of each of the capacitors and the plurality of layers comprise two non-conductive layers.

16. The liquid crystal device of claim 15, wherein the source and gate lines are completely separated by the plurality of layers.

17. The liquid crystal device of claim 15, wherein a total thickness of the plurality of layers located between the source lines and the gate lines at the cross-over locations is greater than a thickness of the insulating film of the capacitors.

18. The liquid crystal device of claim 15, wherein one of the plurality of layers is at least one of a non-doped semiconductor and an impurity-doped semiconductor film.

19. The liquid crystal device of claim 15, wherein the insulating film of the capacitors includes at least one of a silicon nitride layer and a silicon oxide layer.

20. The liquid crystal device of claim 15, wherein the insulating film of the capacitors includes at least one of a TaOx layer and a silicon nitride layer.

21. The liquid crystal device of claim 15, wherein one of the plurality of layers is one of polycrystalline silicon and amorphous silicon.

22. A liquid crystal device, comprising:

a pair of opposed and spaced apart insulating substrates;

a plurality of source lines and a plurality of gate lines disposed on one of the substrates, the source lines intersecting the gate lines at cross-over locations;

a plurality of layers located between the source lines and the gate lines at the cross-over locations;

a plurality of switching elements arranged near the cross-over locations and coupled to the source lines and the gate lines; and a plurality of capacitors electrically coupled to the switching elements, each of the capacitors including an insulating film which functions as a dielectric material of the capacitors, wherein a total thickness of the plurality of layers located between the source lines and the gate lines at the cross-over locations is greater than a thickness of the insulating film of the capacitors and the plurality of layers comprise two non-conductive layers.

23. The liquid crystal device of claim 22, wherein one of the plurality of layers is at least one of a non-doped semiconductor and an impurity-doped semiconductor film.

24. The liquid crystal device of claim 22, wherein one of the plurality of layers is one of polycrystalline silicon and amorphous silicon.

25. The liquid crystal device of claim 22, wherein the insulating film of the capacitors includes at least one of a silicon nitride layer and a silicon oxide layer.

26. The liquid crystal device of claim 22, wherein the insulating film of the capacitors includes at least one of a TaOx layer and a silicon nitride layer.

27. The liquid crystal device of claim 8, wherein the one of the plurality of layers at the cross-over locations being the insulating film extends from the cross-over locations to the plurality of capacitors.

28. A liquid crystal device, comprising:

a pair of opposed and spaced apart insulating substrates;

a plurality of source lines and a plurality of gate lines disposed on one of the substrates, the source lines intersecting the gate lines at cross-over locations;

a plurality of layers located between each of the source lines and each of the gate lines at the cross-over locations, the plurality of layers having non-coextensive edges near the cross-over locations;

a plurality of switching elements coupled to the source lines and the gate lines; and a plurality of capacitors including an insulating film which functions as a dielectric material of the capacitors, one of the plurality of layers of the cross-over locations being the insulating film extending from the cross-over locations to the plurality of capacitors, wherein a total thickness of the plurality of layers at each of the cross-over locations is greater than a thickness of the insulating film of each of the capacitors.

29. The liquid crystal device of claim 28, wherein one of the plurality of layers is one of polycrystalline silicon and amorphous silicon.

30. The liquid crystal device of claim 28, wherein one of the plurality of layers includes at least one non-conductive material selected from the group consisting, of a film of SiN, a film of SiO$_2$, a film of TaOx, a film formed by anodic oxidation of Cr, Ta, Mo, Al and alloys thereof.

31. The liquid crystal device of claim 28, wherein one of the plurality of layers is at least one of a non-doped semiconductor and an impurity-doped semiconductor film.

32. The liquid crystal device of claim 28, wherein the plurality of layers include two non-conductive layers.

33. The liquid crystal device of claim 28, wherein the insulating film of the capacitors includes at least one of a silicon nitride layer and a silicon oxide layer.

34. The liquid crystal device of claim 28, wherein the insulating film of the capacitors includes at least one of a TaOx layer and a silicon nitride layer.

35. A liquid crystal device, comprising:
a pair of opposed and spaced apart insulating substrates;
a plurality of source lines and a plurality of gate lines disposed on one of the substrates, the source lines intersecting the gate lines at cross-over locations;
a plurality of layers located between each of the source lines and each of the gate lines at the cross-over locations, the source and gate lines being completely separated by the plurality of layers;
a plurality of switching elements arranged near the cross-over locations and coupled to the source lines and the gate lines; and
a plurality of capacitors including an insulating film which functions as a dielectric material of the capacitors, one of the plurality of layers of the cross-over locations being the insulating film, wherein a total thickness of the plurality of layers at each of the cross-over locations is greater than a thickness of the insulating film of each of the capacitors.

36. The liquid crystal device of claim 35, wherein the one of the plurality of layers at the cross-over locations being the insulating film extends from the cross-over locations to the plurality of capacitors.

37. The liquid crystal device of claim 35, wherein one of the plurality of layers is one of polycrystalline silicon and amorphous silicon.

38. The liquid crystal device of claim 35, wherein one of the plurality of layers includes at least one non-conductive material selected from the group consisting of a film of SiN, a film of SiO$_2$, a film of TaOx, a film formed by anodic oxidation of Cr, Ta, Mo, Al and alloys thereof.

39. The liquid crystal device of claim 35, wherein one of the plurality of layers is at least one of a non-doped semiconductor and an impurity-doped semiconductor film.

40. The liquid crystal device of claim 35, wherein the plurality of layers include two non-conductive layers.

41. The liquid crystal device of claim 35, wherein the insulating film of the capacitors includes at least one of a silicon nitride layer and a silicon oxide layer.

42. The liquid crystal device of claim 35, wherein the insulating film of the capacitors includes at least one of a TaOx layer and a silicon nitride layer.

43. A liquid crystal device, comprising:
a pair of opposed and spaced apart insulating substrates;
a plurality of source lines and a plurality of gate lines disposed on one of the substrates, the source lines intersecting the gate lines at cross-over locations;
a plurality of layers located between each of the source lines and each of the gate lines at the cross-over locations;
a plurality of switching elements arranged near the cross-over locations and coupled to the source lines and the gate lines; and
a plurality of capacitors electrically coupled to the switching elements, each of the capacitors including an insulating film which functions as a dielectric material of the capacitors, wherein a breakdown voltage of the plurality of layers at each of the cross-over locations is greater than a breakdown voltage of each of the capacitors and the plurality of layers have non-coextensive edges near the cross-over locations.

44. A liquid crystal device, comprising:
a pair of opposed and spaced apart insulating substrates;
a plurality of source lines and a plurality of gate lines disposed on one of the substrates, the source lines intersecting the gate lines at cross-over locations;
a plurality of layers located between each of the source lines and each of the gate lines at the cross-over locations;
a plurality of switching elements arranged near the cross-over locations and coupled to the source lines and the gate lines; and
a plurality of capacitors electrically coupled to the switching elements, each of the capacitors including an insulating film which functions as a dielectric material of the capacitors, wherein a breakdown voltage of the plurality of layers at each of the cross-over locations is greater than a breakdown voltage of each of the capacitors and one of the plurality of layers is the insulating film of the capacitors.

45. A liquid crystal device, comprising:
a pair of opposed and spaced apart insulating substrates;
a plurality of source lines and a plurality of gate lines disposed on one of the substrates, the source lines intersecting the gate lines at cross-over locations;
a plurality of layers located between each of the source lines and each of the gate lines at the cross-over locations;
a plurality of switching elements arranged near the cross-over locations and coupled to the source lines and the gate lines; and
a plurality of capacitors electrically coupled to the switching elements, each of the capacitors including an insulating film which functions as a dielectric material of the capacitors, wherein a breakdown voltage of the plurality of layers at each of the cross-over locations is greater than a breakdown voltage of each of the capacitors and one of the plurality of layers at the cross-over locations is the insulating film extending from the cross-over locations to the plurality of capacitors.

46. A liquid crystal device, comprising:
a pair of opposed and spaced apart insulating substrates;
a plurality of source lines and a plurality of gate lines disposed on one of the substrates, the source lines intersecting the gate lines at cross-over locations;
a plurality of layers located between the source lines and the gate lines at the cross-over locations;
a plurality of switching elements arranged near the cross-over locations and coupled to the source lines and the gate lines; and
a plurality of capacitors electrically coupled to the switching elements, each of the capacitors including an insulating film which functions as a dielectric material of the capacitors, wherein a total thickness of the plurality of layers located between the source lines and the gate lines at the cross-over locations is greater than a thickness of the insulating film of the capacitors and one of the plurality of layers at the cross-over locations is the insulating film extending from the cross-over locations to the plurality of capacitors.

* * * * *